(12) United States Patent
Gupta et al.

(10) Patent No.: US 9,773,683 B2
(45) Date of Patent: Sep. 26, 2017

(54) ATOMIC LAYER OR CYCLIC PLASMA ETCHING CHEMISTRIES AND PROCESSES

(71) Applicant: American Air Liquide, Inc., Fremont, CA (US)

(72) Inventors: Rahul Gupta, Newark, DE (US); Venkateswara R. Pallem, Hockessin, DE (US); Benjamin J. Jurcik, Jr., Landenberg, PA (US)

(73) Assignee: American Air Liquide, Inc., Fremont, CA (US)

(*) Notice: Subject to any disclaimer, the term of this patent is extended or adjusted under 35 U.S.C. 154(b) by 0 days.

(21) Appl. No.: 14/730,917

(22) Filed: Jun. 4, 2015

(65) Prior Publication Data
US 2015/0270140 A1 Sep. 24, 2015

Related U.S. Application Data

(60) Provisional application No. 62/009,484, filed on Jun. 9, 2014.

(51) Int. Cl.
| | |
|---|---|
| *H01L 21/311* | (2006.01) |
| *H01L 21/3213* | (2006.01) |
| *H01L 21/3065* | (2006.01) |
| *H01J 37/32* | (2006.01) |
| *C23F 4/00* | (2006.01) |
| *H01L 43/12* | (2006.01) |

(52) U.S. Cl.
CPC .......... *H01L 21/32136* (2013.01); *C23F 4/00* (2013.01); *H01J 37/32* (2013.01); *H01J 2237/334* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 4,756,794 A | 7/1988 | Yoder | |
| 5,318,664 A * | 6/1994 | Saia et al. | ........... C04B 41/5346 216/67 |
| 5,320,707 A * | 6/1994 | Kanekiyo et al. | ........ C23F 4/00 216/69 |
| 6,143,658 A * | 11/2000 | Donnelly, Jr. et al. | ................. H01L 21/02065 257/E21.311 |

(Continued)

FOREIGN PATENT DOCUMENTS

| | | |
|---|---|---|
| CN | 103117216 | 5/2013 |
| JP | 580980929 | 6/1983 |

(Continued)

OTHER PUBLICATIONS

Agarwal, A., et al., "Plasma Atomic Layer Etching Using Conventional Plasma Equipment", 53$^{rd}$ AVS Symposium, Nov. 2006, 23 pp.

(Continued)

*Primary Examiner* — Allan Olsen
(74) *Attorney, Agent, or Firm* — Patricia E. McQueeney; Yan Jiang

(57) ABSTRACT

Atomic layer or cyclic plasma etching chemistries and processes to etch films are disclosed. Films include Si, Ti, Ta, W, Al, Pd, Ir, Co, Fe, B, Cu, Ni, Pt, Ru, Mn, Mg, Cr, Au, alloys thereof, oxides thereof, nitrides thereof, and combinations thereof.

14 Claims, 19 Drawing Sheets

(56) References Cited

U.S. PATENT DOCUMENTS

| | | | |
|---|---|---|---|
| 6,350,689 B1* | 2/2002 | Ho et al. | H01L 21/02046 257/E21.311 |
| 6,869,868 B2 | 3/2005 | Chiu et al. | |
| 7,365,005 B1* | 4/2008 | Gadgil | C23C 16/045 257/E21.585 |
| 7,416,989 B1* | 8/2008 | Liu | H01L 21/02063 438/706 |
| 7,977,249 B1* | 7/2011 | Liu | H01L 21/31111 216/79 |
| 8,124,505 B1 | 2/2012 | Burnham et al. | |
| 8,617,411 B2* | 12/2013 | Singh | H01L 21/3065 216/62 |
| 8,623,236 B2 | 1/2014 | Kumazawa et al. | |
| 8,633,115 B2 | 1/2014 | Chang et al. | |
| 2011/0006034 A1* | 1/2011 | Hilkene | G03F 7/427 216/22 |
| 2011/0244688 A1* | 10/2011 | Ohsawa | H01L 21/0337 438/702 |
| 2013/0023122 A1* | 1/2013 | Nemani | H01L 21/3105 438/702 |
| 2013/0023124 A1* | 1/2013 | Nemani | H01L 21/31144 438/703 |
| 2014/0017898 A1* | 1/2014 | Nemani | H01L 21/308 438/703 |
| 2014/0120726 A1* | 5/2014 | Nemani | H01L 21/3105 438/694 |
| 2014/0206192 A1 | 7/2014 | Yeom et al. | |
| 2014/0273492 A1* | 9/2014 | Anthis | H01L 21/32135 438/720 |
| 2015/0011093 A1 | 1/2015 | Singh et al. | |
| 2015/0017810 A1 | 1/2015 | Guha | |
| 2015/0162214 A1* | 6/2015 | Thompson | H01L 21/32051 438/669 |
| 2016/0064519 A1* | 3/2016 | Yang | H01L 29/66545 438/712 |

FOREIGN PATENT DOCUMENTS

| | | |
|---|---|---|
| JP | H0794492 | 4/1995 |
| KR | 2013 0049506 | 5/2013 |
| KR | 101464338 | 11/2014 |
| KR | 101466487 | 12/2014 |
| WO | WO 2009 087609 | 7/2009 |

OTHER PUBLICATIONS

Chang, J.P., et al., "Non-PFC Plasma Chemistries for Patterning Complex Materials/Structures", (Task No. 425.038), SRC Engineering Research Center for Environmentally Benign Semiconductor Manufacturing, May 16, 2013, 32 pp.

Kanarik, K.J. et al., "Moving atomic layer etch for lab to fab", Solid State Technology, Dec. 2013, pp. 14-17.

Lee, Y., et al., "Atomic Layer Etching of Al2O3 Using Sequential, Self-Limiting Thermal Reactions with Sn (acac)2 and Hydrogen Fluoride", ASC NANO, 2015, 9 (2), pp. 2061-2070.

Lee, W.H., et al, "Taper Etching of Copper Using an Inductively Coupled O2 Plasma and Hexafluoroacetylacetone", Journal of the Korean Physical Society, 40, Jan. 1, 2002, pp. 152-155.

Manos, D.M., et al., "Plasma etching: an introduction", Academic Press, 1989, pp. 12-13.

3M Novec Engineered Fluids, "Precision drying: solvent technology for drying of semiconductor wafers," 2009, 4 pgs., downloaded at https://www.google.com/search?q=surface+cleaning+and+wet+processing+terminology+1999&oq=surface+cleaning+and+wet+processing+terminology+1999&aqs=chrome..69i57j6 9i59.15319j0j9&sourceid=chrome&ie=UTF-8&safe=active&ssui=on#safe=active&q=3m+novec+engineered+fluid+Precision+drying:+solvent+technology+for+drying+of+semiconductor+wafers.

University of Arizona, "Surface cleaning and wet processing terminology," 1999, 15, downloaded at https://www.google.com/search?q=surface+cleaning+and+wet+processing+terminology+1999&oq=surface+cleaning+and+wet+processing+terminology+1999&aqs=chrome..69i57j69i59.15319j0j9&sourceid=chrome&ie=UTF-8&safe=active&ssui=on.

* cited by examiner

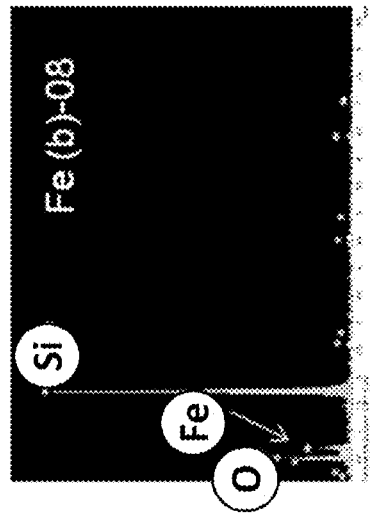
FIG 17 15 cycl – Cl$_2$/Ethanol
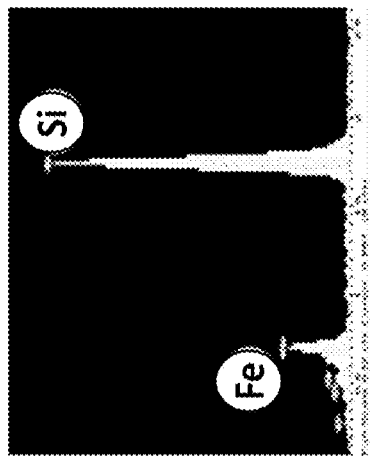
FIG 16 Un-etched Fe
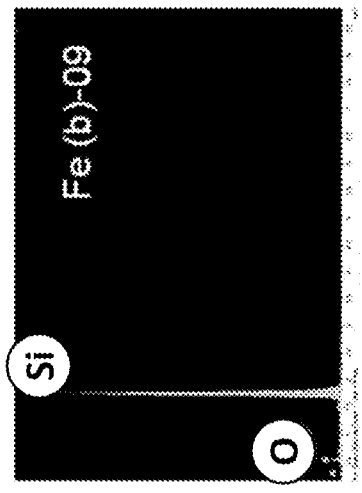
FIG 19 45 cycl – Cl$_2$/Ethanol
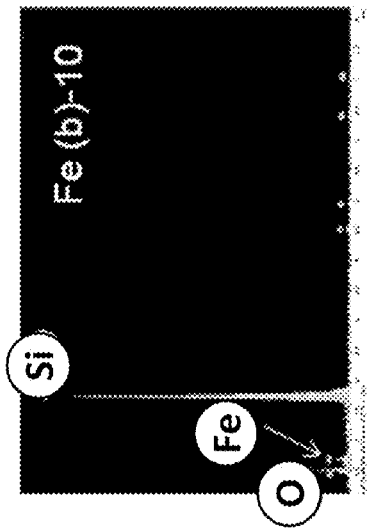
FIG 18 30 cycl – Cl$_2$/Ethanol

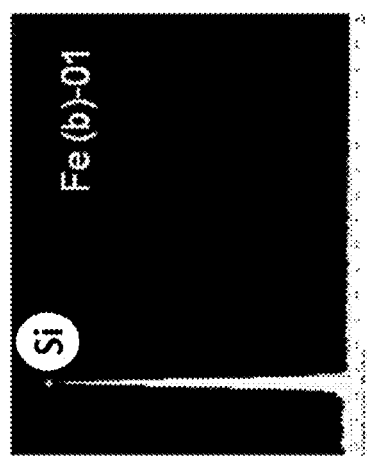
FIG 20 74 cycl — Cl₂/Ethanol
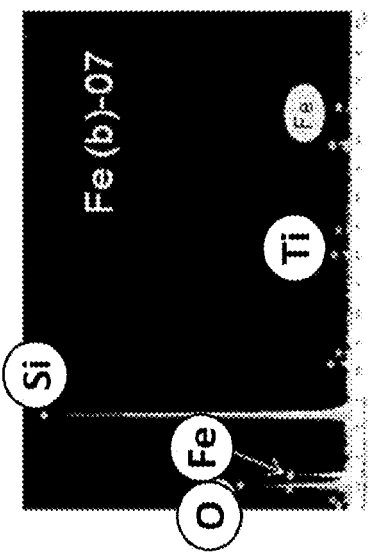
FIG 21 100 cycl — Cl₂
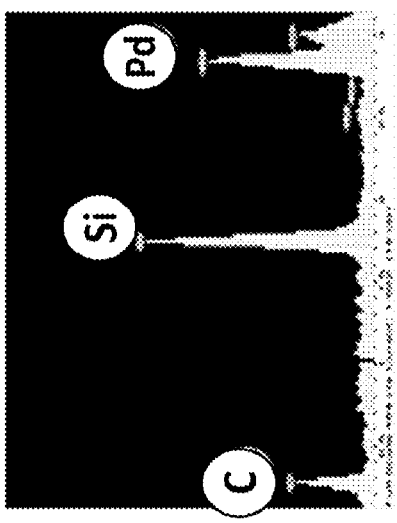
FIG 22. Un-etched Pd
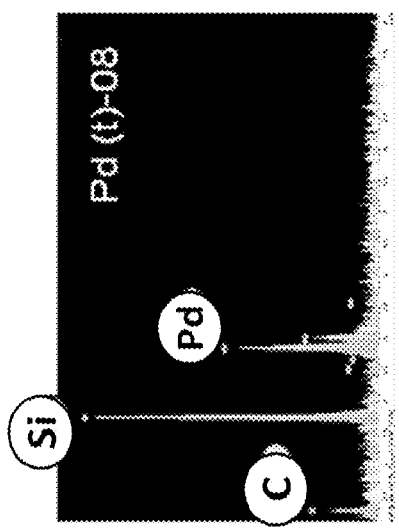
FIG 23. 15 cycl — Cl₂/Ethanol

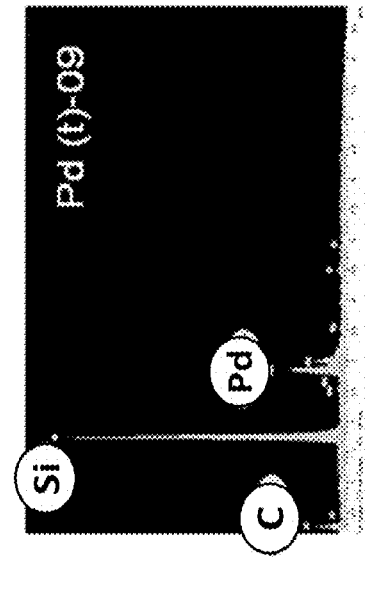
FIG 24. 30 cycl – Cl₂/Ethanol
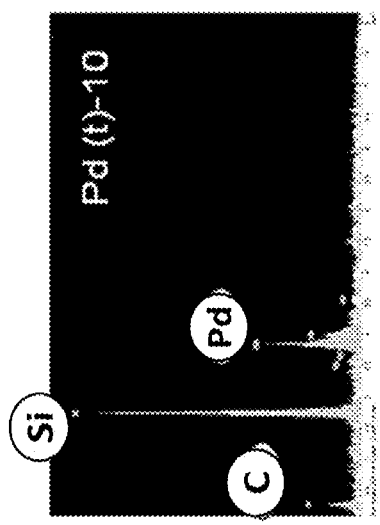
FIG 25 45 cycl – Cl₂/Ethanol
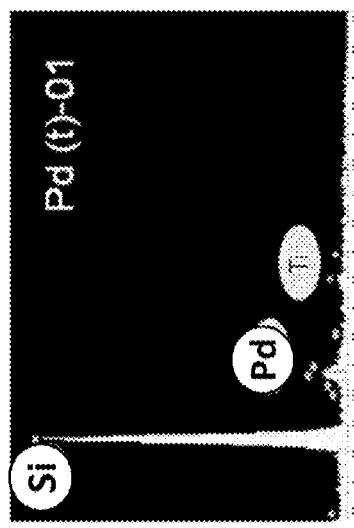
FIG 26 74 cycl – Cl₂/Ethanol
FIG 27 100 cycl – Cl₂

ATOMIC LAYER OR CYCLIC PLASMA ETCHING CHEMISTRIES AND PROCESSES

CROSS REFERENCE TO RELATED APPLICATIONS

The present application claims the benefit of U.S. Provisional Application Ser. No. 62/009,484 filed Jun. 9, 2014, herein incorporated by reference in its entirety for all purposes.

TECHNICAL FIELD

Atomic layer or cyclic etching chemistries and processes to etch films are disclosed. Exemplary films may include mask films, such as Ti-containing films, Ta-containing films, W-containing films, or Al-containing films. Exemplary films may alternatively include metal films, such as Pd, Ir, Co, Fe, B, Cu, Ni, Pt, Ru, Mn, Mg, Cr, Au, alloys thereof, oxides thereof, nitrides thereof, or combinations thereof.

BACKGROUND

Atomic layer etching is a cyclic dry etching process used in the semiconductor manufacturing industry to remove one layer of the material to be etched per cycle.

Many etchants have been disclosed for use in continuous (i.e., non-cyclic) etch process. See, e.g., US2015/011093 and US2015/017810.

Many initial processes use a plasma etch gas cycle followed by a plasma inert gas cycle. For example, the December 2013 issue of Solid State Technology magazine discusses an atomic layer etching process of a silicon layer using chlorine ($Cl_2$) and Argon (Ar). U.S. Pat. No. 4,756,794 discloses an atomic layer etching method to remove diamond by $NO_2$ followed by ion bombardment. Agarwal and Kushner presented the computer simulated results of atomic layer etching of a Si layer using a cycle of $Cl_2$/Ar followed by Ar alone and atomic layer etching of a $SiO_2$ layer using a cycle of c-$C_4F_8$/Ar followed by Ar alone (Plasma Atomic Layer Etching Using Conventional Plasma Equipment at the $53^{rd}$ AVS Symposium in November 2006). CN103117216 discloses an atomic layer etching method to remove an oxide or gate dielectric layer using a fluorocarbon gas ($C_xF_y$, specifically $CF_4$) mixed with an inert gas (Ar) followed by Ar. US2014/206192 discloses an atomic layer etching method to remove graphene using O-based (such as $CO_2$, $O_2$, $NO_2$), F-based (such as $C_4F_8$, $CF_4$, or $CHF_3$), H-based (such as $H_2$, $NH_3$, or $SiH_4$) gas plasmas, or combinations thereof, followed by an energy source (such as neutral beam, ionic beam, heat energy, plasma, laser, or combinations thereof). The neutral beam may contain He, Ar, $N_2$, Ne or Xe. KR20110098355, KR101465338, and KR101466487 disclose atomic layer etching methods using $BCl_3$ followed by irradiation by Ar or Ne ion beam or neutral beam to remove single layers of $HfO_2$/$ZrO_2$/$Ta_2O_5$; $Al_2O_3$, or BeO; respectively. U.S. Pat. No. 8,617,411 discloses an atomic layer etching method using $Cl_2$, HCl, $CHF_3$, $CH_2F_2$, $CH_3F$, $H_2$, $BCl_3$, $SiCl_4$, $Br_2$, HBr, $NF_3$, $CF_4$, $SF_6$, $O_2$, $SO_2$, COS, etc., followed by an inert gas (Ar, He, Kr, Ne, Xe, etc.).

However, as these methods do not always remove the layer in a satisfactory manner, additional variations of atomic layer etching have been developed. For example, Lee and George disclose atomic layer etching of $Al_2O_3$ using sequential, self-limiting thermal reactions with Sn(acac)$_2$ and HF (ACS Nano, 2015, 9 (2) pp. 2061-2070). JP58098929 to Seiko Epson Corp. discloses an atomic layer etching method to remove $SiO_2$ from a Si substrate by HF followed by $I_2$. U.S. Pat. No. 8,633,115 disclosed an atomic layer etching process to remove $SiO_2$ by introducing $H_2O$ or $NH_3$ followed by HF and a temperature change. U.S. Pat. No. 8,124,505 discloses a two stage plasma technique using oxygen to oxidize the surface of the aluminum gallium nitride barrier layer followed by using $BCl_3$ to remove the oxidized layer.

A need remains for more precise dry processes to selectively remove layers without damaging the surrounding materials or leaving significant residue on the substrate.

NOTATION AND NOMENCLATURE

Certain abbreviations, symbols, and terms are used throughout the following description and claims, and include:

As used herein, the term "etch" or "etching" refers to a plasma or thermal etch process (i.e., a dry etch process). "Plasma etch" refers to ion bombardment accelerating the chemical reaction in the vertical direction (Manos and Flamm, Plasma Etching An Introduction, Academic Press, Inc. 1989 pp. 12-13). "Thermal etch" refers to heat activating the chemical reaction on the reactive surface of a substrate. The disclosed etching processes may (a) remove deposits from chamber walls, (b) remove a mask or patterned layer from a substrate after patterning, or (c) produce apertures, such as vias, trenches, channel holes, gate trenches, staircase contacts, capacitor holes, contact holes, etc., in the substrate.

As used herein, the term "dry" means the vapor phase of a material. "Dry" is not used herein to directly address the water content of any material, even though the water content of the disclosed materials is very low. In other words, any "dry" material referenced herein is in its vapor phase, notwithstanding the amount of water present in the material.

As used herein, the term "purge", "purged", or "purging" means to remove the gaseous contents of the chamber by using an inert gas and/or a vacuum.

As used herein, the term "atomic layer etch" means removing one atomic layer of a semiconductor material at a time. Atomic layer etch has been referred to as reverse atomic layer deposition.

The term "pattern etch" or "patterned etch" refers to etching a non-planar structure, for example by placing a patterned mask layer on a stack of metal- and/or silicon-containing layers and etching vias or trenches or the like in the areas not covered by the mask. The term "mask" refers to the layer that resists etching. The mask layer may be located above or below (i.e., the etch stop layer) the layer to be etched. The mask layer may be a hardmask, such as TiN or TaN, or a soft mask, such as a polymer or other organic "soft" resist materials. A "sacrificial mask" material is a material that is used to pattern a substrate and then removed.

The term "selectivity" means the ratio of the etch rate of one material to the etch rate of another material. The term "selective etch" or "selectively etch" means to etch one material more than another material, for example, to selectively etch the mask material from the substrate, or in other words to have a greater or less than 1:1 etch selectivity between two materials.

As used herein, the indefinite article "a" or "an" means one or more.

As used herein, the terms "approximately" or "about" mean±10% of the value stated.

As used herein, the term "pulsing" means both introducing the gaseous compound into and removing the gaseous compound from the chamber.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x\ (NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, t-butyl, sec-butyl); the abbreviation "tBu" refers to a tert-butyl group; the abbreviation "sBu" refers to a sec-butyl group; the abbreviation "iBu" refers to an iso-butyl group; and the abbreviation "OH" refers to a hydroxyl group.

The standard abbreviations of the elements from the periodic table of elements are used herein. It should be understood that elements may be referred to by these abbreviations (e.g., F refers to fluorine, Ti refers to titanium, N refers to nitrogen, etc.).

Please note that several films, such as TiN, are listed throughout the specification and claims without reference to their proper stoichiometry. TiN is $TiN_xO_y$, wherein x ranges from 0.1 to 2 and y is 0 or 1.

SUMMARY

Methods of removing films from substrates are disclosed. A vapor of a halide-containing compound is introduced into a chamber containing the substrate having the film disposed thereon. Plasma is ignited in the chamber. The chamber is purged. The vapor of a volatile organic compound is introduced into the chamber. The chamber is purged. The disclosed methods may include one or more of the following aspects:

- removing native oxide from the film by sputtering with argon plasma prior to introduction of the vapor of the halide-containing compound;
- sputtering the film with argon plasma prior to introduction of the vapor of the halide-containing compound;
- further comprising igniting a plasma after introduction of the vapor of the volatile organic compound;
- repeating the halide-containing compound introduction, ignition, purging, volatile organic compound introduction, and purging steps;
- wherein performing the halide-containing compound introduction, ignition, purging, volatile organic compound introduction, and purging steps one time removes one atomic layer of the film;
- further comprising repeating the volatile organic compound introduction and purging steps;
- the substrate being a silicon-containing substrate;
- the substrate being a low k layer;
- the substrate being SiN;
- the substrate being a metal-containing substrate;
- the substrate being Co;
- the substrate being Ni;
- the film being Si, Ti, Ta, W, Al, Pd, Ir, Co, Fe, B, Cu, Ni, Pt, Ru, Mn, Mg, Cr, Au, alloys thereof, oxides thereof, nitrides thereof, or combinations thereof;
- the film being a sacrificial mask material;
- the sacrificial mask material being selected from the group consisting of Ti-containing films, Ta-containing films, W-containing films, and Al-containing films;
- the Ti-containing film being Ti;
- the Ti-containing film being $TiN_xO_y$, wherein x ranges from 0.1 to 2 and y ranges from 0 to 1;
- the Ta-containing film being Ta;
- the sacrificial mask material being $TaN_xO_y$, wherein x ranges from 0.1 to 2 and y ranges from 0 to 0.5;
- the W-containing film being W;
- the W-containing film being $WN_xO_y$, wherein x and y each independently ranges from 0 to 2;
- the Al-containing film being Al;
- the Al-containing film being $AlCu_x$, wherein x ranges from 0 to 8;
- the metal layer being an alkaline earth metal layer;
- the alkaline earth metal layer being a Mg layer;
- the metal layer being a transition metal layer;
- the transition metal layer being selected from the group consisting of Zr, Ta, Cr, Mn, Fe, Ru, Co, Ir, Ni, Pd, Pt, Cu, Au, alloy thereof, oxides thereof, nitrides thereof, and combinations thereof;
- the transition metal layer being a Zr layer;
- the transition metal layer being a Ta layer;
- the transition metal layer being a Cr layer;
- the transition metal layer being a Mn layer;
- the transition metal layer being a Fe layer;
- the transition metal layer being a Ru layer;
- the transition metal layer being a Co layer;
- the transition metal layer being a Ir layer;
- the transition metal layer being a Ni layer;
- the transition metal layer being a Pd layer;
- the transition metal layer being a Pt layer;
- the transition metal layer being a Cu layer;
- the transition metal layer being a Au layer;
- the metal layer being a metalloid layer;
- the metalloid layer being a B layer;
- the metalloid layer being a Si layer;
- the halide-containing compound being selected from the group consisting of $Cl_2$, HCl, $SOCl_2$, $Br_2$, $I_2$, $BCl_3$, $BBr_3$, $SO_2Cl_2$, FCl, $ClF_3$, HBr, HI, $F_2$, HF, $NF_3$, $POCl_3$, $CF_4$, $CHF_3$, $SF_6$, $CCl_4$, $CF_3I$, $CF_3Cl$, and $CF_3Br$;
- the halide-containing compound being $Cl_2$;
- the halide-containing compound being HCl;
- the halide-containing compound being $SOCl_2$;
- the halide-containing compound being $Br_2$;
- the halide-containing compound being $I_2$;
- the halide-containing compound being $BCl_3$;
- the halide-containing compound being $BBr_3$;
- the halide-containing compound being $SO_2Cl_2$;
- the halide-containing compound being FCl;
- the halide-containing compound being $ClF_3$;
- the halide-containing compound being HBr;

the halide-containing compound being HI;
the halide-containing compound being $F_2$;
the halide-containing compound being HF;
the halide-containing compound being $NF_3$;
the halide-containing compound being $POCl_3$;
the halide-containing compound being $CF_4$;
the halide-containing compound being $CHF_3$;
the halide-containing compound being $SF_6$;
the halide-containing compound being $CCl_4$;
the halide-containing compound being $CF_3I$;
the halide-containing compound being $CF_3Cl$;
the halide-containing compound being $CF_3Br$;
the volatile organic compound consisting of the elements C, F, H, N, O, or combinations thereof;
the volatile organic compound being selected from the group consisting of alcohols, ethers, amines, amidinates, hydrazines, diketones, carboxylic acids, aldehydes, ketoimines, diketimines, bis(silyl)amides, and anhydrides;
the volatile organic compound being an oxygen-containing compound;
the volatile organic compound being a nitrogen-containing compound;
the volatile organic compound being an alcohol;
the alcohol being methanol, ethanol, or isopropanol;
the alcohol being ethanol;
the volatile organic compound being an ether;
the ether being dimethyl ether or diethyl ether;
the volatile organic compound being an amine;
the amine being methylamine, dimethylamine, ethylamine, diethylamine, isopropylamine, or diisopropylamine;
the volatile organic compound being an amidinate;
the volatile organic compound being N,N'-bis(1-methylethyl)ethanimidamide;
the volatile organic compound being a hydrazine;
the hydrazine being $Me_2NNMe_2$ or $Et_2NNH_2$;
the volatile organic compound being a diketone;
the diketone being acetyl acetone or hexafluoroacetylacetone;
the diketone being acetyl acetone;
the volatile organic compound being a carboxylic acid;
the carboxylic acid being acetic acid;
the volatile organic compound being an aldehyde;
the aldehyde being formaldehyde or acetaldehyde;
the volatile organic compound being a ketoimines;
the ketoimine being 4-ethylamino-pent-3-en-2-one;
the volatile organic compound being a diketimine;
the diketimine being N,N-diethylpentadiamine;
the volatile organic compound being a bis(silyl)amides;
the bis(silyl)amide having the formula $R_3Si$—NH—$SiR_3$, wherein each R is independently selected from a C1 to C5 alkyl group;
the bis(silyl)amide being bis(trimethylsilyl)amide;
the volatile organic compound being an anhydrides; and
the anhydride being acetic anhydride.

Methods of removing materials from substrates are disclosed. A vapor of a halide-containing compound is introduced into a chamber containing the substrate having the material disposed thereon. Plasma is ignited in the chamber. The chamber is purged. The vapor of a volatile organic compound is introduced into the chamber. The chamber is purged. The disclosed methods may include one or more of the following aspects:

removing native oxide from the material by sputtering with argon plasma prior to introduction of the vapor of the halide-containing compound;
sputtering the material with argon plasma prior to introduction of the vapor of the halide-containing compound;
further comprising igniting a plasma after introduction of the vapor of the volatile organic compound;
repeating the halide-containing compound introduction, ignition, purging, volatile organic compound introduction, and purging steps;
wherein performing the halide-containing compound introduction, ignition, purging, volatile organic compound introduction, and purging steps one time removes one atomic layer of the material;
further comprising repeating the volatile organic compound introduction and purging steps;
the substrate being a component part of the chamber;
the substrate being alumina;
the substrate being passivated alumina;
the substrate being SiC;
the substrate being passivated SiC;
the substrate being SiCN;
the substrate being passivated SiCN;
the substrate being aluminum;
the substrate being passivated aluminum;
the substrate being quartz;
the substrate being passivated quartz;
the substrate being ceramic;
the substrate being passivated ceramic;
the substrate being a Teflon® coating material sold by E.I. Du Pont de Nemours and Company;
the substrate being a passivated Teflon material;
the substrate being steel;
the substrate being passivated steel;
the substrate being a silicon-containing substrate;
the substrate being a low k layer;
the substrate being SiN;
the substrate being a metal-containing substrate;
the substrate being Co;
the substrate being Ni;
the material being Si, Ti, Ta, W, Al, Pd, Ir, Co, Fe, B, Cu, Ni, Pt, Ru, Mn, Mg, Cr, Au, alloys thereof, oxides thereof, nitrides thereof, or combinations thereof;
The material being a sacrificial mask material;
the sacrificial mask material being selected from the group consisting of Ti-containing films, Ta-containing films, W-containing films, and Al-containing films;
the Ti-containing film being Ti;
the Ti-containing film being $TiN_xO_y$, wherein x ranges from 0.1 to 2 and y ranges from 0 to 1;
the Ta-containing film being Ta;
the Ta-containing film being $TaN_xO_y$, wherein x ranges from 0.1 to 2 and y ranges from 0 to 0.5;
the W-containing film being W;
the W-containing film being $WN_xO_y$, wherein x and y each independently ranges from 0 to 2;
the Al-containing film being Al;
the Al-containing film being $AlCu_x$, wherein x ranges from 0 to 8;
the metal layer being an alkaline earth metal layer;
the alkaline earth metal layer being a Mg layer;
the metal layer being a transition metal layer;
the transition metal layer being selected from the group consisting of Zr, Ta, Cr, Mn, Fe, Ru, Co, Ir, Ni, Pd, Pt, Cu, Au, alloy thereof, oxides thereof, nitrides thereof, and combinations thereof;
the transition metal layer being a Zr layer;
the transition metal layer being a Ta layer;
the transition metal layer being a Cr layer;

the transition metal layer being a Mn layer;
the transition metal layer being a Fe layer;
the transition metal layer being a Ru layer;
the transition metal layer being a Co layer;
the transition metal layer being a Ir layer;
the transition metal layer being a Ni layer;
the transition metal layer being a Pd layer;
the transition metal layer being a Pt layer;
the transition metal layer being a Cu layer;
the transition metal layer being a Au layer;
the metal layer being a metalloid layer;
the metalloid layer being a B layer;
the metalloid layer being a Si layer;
the halide-containing compound being selected from the group consisting of $Cl_2$, HCl, $SOCl_2$, $Br_2$, $I_2$, $BCl_3$, $BBr_3$, $SO_2Cl_2$, FCl, $ClF_3$, HBr, HI, $F_2$, HF, $NF_3$, $POCl_3$, $CF_4$, $CHF_3$, $SF_6$, $CCl_4$, $CF_3I$, $CF_3Cl$, and $CF_3Br$;
the halide-containing compound being $Cl_2$;
the halide-containing compound being HCl;
the halide-containing compound being $SOCl_2$;
the halide-containing compound being $Br_2$;
the halide-containing compound being $I_2$;
the halide-containing compound being $BCl_3$;
the halide-containing compound being $BBr_3$;
the halide-containing compound being $SO_2Cl_2$;
the halide-containing compound being FCl;
the halide-containing compound being $ClF_3$;
the halide-containing compound being HBr;
the halide-containing compound being HI;
the halide-containing compound being $F_2$;
the halide-containing compound being HF;
the halide-containing compound being $NF_3$;
the halide-containing compound being $POCl_3$;
the halide-containing compound being $CF_4$;
the halide-containing compound being $CHF_3$;
the halide-containing compound being $SF_6$;
the halide-containing compound being $CCl_4$;
the halide-containing compound being $CF_3I$;
the halide-containing compound being $CF_3Cl$;
the halide-containing compound being $CF_3Br$;
the volatile organic compound consisting of the elements C, F, H, N, O, or combinations thereof;
the volatile organic compound being selected from the group consisting of alcohols, ethers, amines, amidinates, hydrazines, diketones, carboxylic acids, aldehydes, ketoimines, diketimines, bis(silyl)amides, and anhydrides;
the volatile organic compound being an oxygen-containing compound;
the volatile organic compound being a nitrogen-containing compound;
the volatile organic compound being an alcohol;
the alcohol being methanol, ethanol, or isopropanol;
the alcohol being ethanol;
the volatile organic compound being an ether;
the ether being dimethyl ether or diethyl ether;
the volatile organic compound being an amine;
the amine being methylamine, dimethylamine, ethylamine, diethylamine, isopropylamine, or diisopropylamine;
the volatile organic compound being an amidinate;
the volatile organic compound being N,N'-bis(1-methylethyl)ethanimidamide;
the volatile organic compound being a hydrazine;
the hydrazine being $Me_2NNMe_2$ or $Et_2NNH_2$;
the volatile organic compound being a diketone;
the diketone being acetyl acetone or hexafluoroacetylacetone;
the diketone being acetyl acetone;
the volatile organic compound being a carboxylic acid;
the carboxylic acid being acetic acid;
the volatile organic compound being an aldehyde;
the aldehyde being formaldehyde or acetaldehyde;
the volatile organic compound being a ketoimines;
the ketoimine being 4-ethylamino-pent-3-en-2-one;
the volatile organic compound being a diketimine;
the diketimine being N,N-diethylpentadiamine;
the volatile organic compound being a bis(silyl)amides;
the bis(silyl)amide having the formula $R_3Si$—NH—$SiR_3$, wherein each R is independently selected from a C1 to C5 alkyl group;
the bis(silyl)amide being bis(trimethylsilyl)amide;
the volatile organic compound being an anhydrides; and
the anhydride being acetic anhydride.

Methods of etching sacrificial mask materials from substrates are disclosed. A vapor of a halide-containing compound is pulsed into a chamber containing the substrate having the sacrificial mask material disposed thereon. Plasma is ignited in the chamber during the halide-containing compound pulse. The vapor of a volatile organic compound is pulsed into the chamber. The disclosed methods may include one or more of the following aspects:
  removing native oxide from the sacrificial mask material by sputtering with argon plasma prior to pulsing of the vapor of the halide-containing compound;
  sputtering the sacrificial mask material with argon plasma prior to pulsing of the vapor of the halide-containing compound;
  further comprising igniting a plasma during the volatile organic compound pulse;
  repeating the halide-containing compound pulse, ignition, and volatile organic compound pulse steps;
  further comprising repeating the volatile organic compound pulse step;
  wherein performing the halide-containing compound pulse, ignition, and volatile organic compound pulse steps one time etches one atomic layer of the sacrificial mask material;
  the substrate being a silicon-containing substrate;
  the substrate being a low k layer;
  the substrate being SiN;
  the substrate being a metal-containing substrate;
  the substrate being Co;
  the substrate being Ni;
  the sacrificial mask material being selected from the group consisting of Ti-containing films, Ta-containing films, W-containing films, and Al-containing films;
  the Ti-containing film being Ti;
  the Ti-containing film being $TiN_xO_y$, wherein x ranges from 0.1 to 2 and y ranges from 0 to 1;
  the Ta-containing film being Ta;
  the Ta-containing film being $TaN_xO_y$, wherein x ranges from 0.1 to 2 and y ranges from 0 to 0.5;
  the W-containing film being W;
  the W-containing film being $WN_xO_y$, wherein x and y each independently ranges from 0 to 2;
  the Al-containing film being Al;
  the Al-containing film being $AlCu_x$, wherein x ranges from 0 to 8;
  the halide-containing compound being selected from the group consisting of $Cl_2$, HCl, $SOCl_2$, $Br_2$, $I_2$, $BCl_3$, $BBr_3$, $SO_2Cl_2$, FCl, $ClF_3$, HBr, HI, $F_2$, HF, $NF_3$, $POCl_3$, $CF_4$, $CHF_3$, $SF_6$, $CCl_4$, $CF_3I$, $CF_3Cl$, and $CF_3Br$;

the halide-containing compound being $Cl_2$;
the halide-containing compound being HCl;
the halide-containing compound being $SOCl_2$;
the halide-containing compound being $Br_2$;
the halide-containing compound being $I_2$;
the halide-containing compound being $BCl_3$;
the halide-containing compound being $BBr_3$;
the halide-containing compound being $SO_2Cl_2$;
the halide-containing compound being FCl;
the halide-containing compound being $ClF_3$;
the halide-containing compound being HBr;
the halide-containing compound being HI;
the halide-containing compound being $F_2$;
the halide-containing compound being HF;
the halide-containing compound being $NF_3$;
the halide-containing compound being $POCl_3$;
the halide-containing compound being $CF_4$;
the halide-containing compound being $CHF_3$;
the halide-containing compound being $SF_6$;
the halide-containing compound being $CCl_4$;
the halide-containing compound being $CF_3I$;
the halide-containing compound being $CF_3Cl$;
the halide-containing compound being $CF_3Br$;
the volatile organic compound consisting of the elements C, F, H, N, O, or combinations thereof;
the volatile organic compound being selected from the group consisting of alcohols, ethers, amines, amidinates, hydrazines, diketones, carboxylic acids, aldehydes, ketoimines, diketimines, bis(silyl)amides, and anhydrides;
the volatile organic compound being an oxygen-containing compound;
the volatile organic compound being a nitrogen-containing compound;
the volatile organic compound being an alcohol;
the alcohol being methanol, ethanol, or isopropanol;
the alcohol being ethanol;
the volatile organic compound being an ether;
the ether being dimethyl ether or diethyl ether;
the volatile organic compound being an amine;
the amine being methylamine, dimethylamine, ethylamine, diethylamine, isopropylamine, or diisopropylamine;
the volatile organic compound being an amidinate;
the volatile organic compound being N,N'-bis(1-methylethyl)ethanimidamide;
the volatile organic compound being a hydrazine;
the hydrazine being $Me_2NNMe_2$ or $Et_2NNH_2$;
the volatile organic compound being a diketone;
the diketone being acetyl acetone or hexafluoroacetylacetone;
the diketone being acetyl acetone;
the volatile organic compound being a carboxylic acid;
the carboxylic acid being acetic acid;
the volatile organic compound being an aldehyde;
the aldehyde being formaldehyde or acetaldehyde;
the volatile organic compound being a ketoimines;
the ketoimine being 4-ethylamino-pent-3-en-2-one;
the volatile organic compound being a diketimine;
the diketimine being N,N-diethylpentadiamine;
the volatile organic compound being a bis(silyl)amides;
the bis(silyl)amide having the formula $R_3Si-NH-SiR_3$, wherein each R is independently selected from a C1 to C5 alkyl group;
the bis(silyl)amide being bis(trimethylsilyl)amide;
the volatile organic compound being an anhydrides; and
the anhydride being acetic anhydride.

Methods of etching metal layers from substrates are disclosed. A vapor of a halide-containing compound is pulsed into a chamber containing the substrate having the layer disposed thereon. Plasma is ignited in the chamber during the halide-containing compound pulse. The vapor of a volatile organic compound is pulsed into the chamber. The disclosed methods may include one or more of the following aspects:
removing native oxide from the metal layer by sputtering with argon plasma prior to pulsing of the vapor of the halide-containing compound;
sputtering the metal layer with argon plasma prior to pulsing of the vapor of the halide-containing compound;
further comprising igniting a plasma during the volatile organic compound pulse;
repeating the halide-containing compound pulse, ignition, and volatile organic compound pulse steps;
further comprising repeating the volatile organic compound pulse step;
wherein performing the halide-containing compound pulse, ignition, and volatile organic compound pulse steps one time etches one atomic layer of the metal layer;
the substrate being a component part of the chamber;
the substrate being alumina;
the substrate being passivated alumina;
the substrate being SiC;
the substrate being passivated SiC;
the substrate being SiCN;
the substrate being passivated SiCN;
the substrate being aluminum;
the substrate being passivated aluminum;
the substrate being quartz;
the substrate being passivated quartz;
the substrate being ceramic;
the substrate being passivated ceramic;
the substrate being a Teflon material;
the substrate being a passivated Teflon material;
the substrate being steel;
the substrate being passivated steel;
the substrate being a silicon-containing substrate;
the substrate being a low k layer;
the substrate being SiN;
the substrate being a metal-containing substrate;
the substrate being Co;
the substrate being Ni;
the metal layer being an alkaline earth metal layer;
the alkaline earth metal layer being a Mg layer;
the metal layer being a transition metal layer;
the transition metal layer being selected from the group consisting of Zr, Ta, Cr, Mn, Fe, Ru, Co, Ir, Ni, Pd, Pt, Cu, Au, alloy thereof, oxides thereof, nitrides thereof, and combinations thereof;
the transition metal layer being a Zr layer;
the transition metal layer being a Ta layer;
the transition metal layer being a Cr layer;
the transition metal layer being a Mn layer;
the transition metal layer being a Fe layer;
the transition metal layer being a Ru layer;
the transition metal layer being a Co layer;
the transition metal layer being a Ir layer;
the transition metal layer being a Ni layer;
the transition metal layer being a Pd layer;
the transition metal layer being a Pt layer;
the transition metal layer being a Cu layer;
the transition metal layer being a Au layer;

the metal layer being a metalloid layer;
the metalloid layer being a B layer;
the metalloid layer being a Si layer;
the halide-containing compound being selected from the group consisting of $Cl_2$, HCl, $SOCl_2$, $Br_2$, $I_2$, $BCl_3$, $BBr_3$, $SO_2Cl_2$, FCl, $ClF_3$, HBr, HI, $F_2$, HF, $NF_3$, $POCl_3$, $CF_4$, $CHF_3$, $SF_6$, $CCl_4$, $CF_3I$, $CF_3Cl$, and $CF_3Br$;
the halide-containing compound being $Cl_2$;
the halide-containing compound being HCl;
the halide-containing compound being $SOCl_2$;
the halide-containing compound being $Br_2$;
the halide-containing compound being $I_2$;
the halide-containing compound being $BCl_3$;
the halide-containing compound being $BBr_3$;
the halide-containing compound being $SO_2Cl_2$;
the halide-containing compound being FCl;
the halide-containing compound being $ClF_3$;
the halide-containing compound being HBr;
the halide-containing compound being HI;
the halide-containing compound being $F_2$;
the halide-containing compound being HF;
the halide-containing compound being $NF_3$;
the halide-containing compound being $POCl_3$;
the halide-containing compound being $CF_4$;
the halide-containing compound being $CHF_3$;
the halide-containing compound being $SF_6$;
the halide-containing compound being $CCl_4$;
the halide-containing compound being $CF_3I$;
the halide-containing compound being $CF_3Cl$;
the halide-containing compound being $CF_3Br$;
the volatile organic compound consisting of the elements C, F, H, N, O, or combinations thereof;
the volatile organic compound being selected from the group consisting of alcohols, ethers, amines, amidinates, hydrazines, diketones, carboxylic acids, aldehydes, ketoimines, diketimines, bis(silyl)amides, and anhydrides;
the volatile organic compound being an oxygen-containing compound;
the volatile organic compound being a nitrogen-containing compound;
the volatile organic compound being an alcohol;
the alcohol being methanol, ethanol, or isopropanol;
the alcohol being ethanol;
the volatile organic compound being an ether;
the ether being dimethyl ether or diethyl ether;
the volatile organic compound being an amine;
the amine being methylamine, dimethylamine, ethylamine, diethylamine, isopropylamine, or diisopropylamine;
the volatile organic compound being an amidinate;
the volatile organic compound being N,N'-bis(1-methylethyl)ethanimidamide;
the volatile organic compound being a hydrazine;
the hydrazine being $Me_2NNMe_2$ or $Et_2NNH_2$;
the volatile organic compound being a diketone;
the diketone being acetyl acetone or hexafluoroacetylacetone;
the diketone being acetyl acetone;
the volatile organic compound being a carboxylic acid;
the carboxylic acid being acetic acid;
the volatile organic compound being an aldehyde;
the aldehyde being formaldehyde or acetaldehyde;
the volatile organic compound being a ketoimines;
the ketoimine being 4-ethylamino-pent-3-en-2-one;
the volatile organic compound being a diketimine;
the diketimine being N,N-diethylpentadiamine;
the volatile organic compound being a bis(silyl)amides;
the bis(silyl)amide having the formula $R_3Si$—NH—$SiR_3$, wherein each R is independently selected from a C1 to C5 alkyl group;
the bis(silyl)amide being bis(trimethylsilyl)amide;
the volatile organic compound being an anhydrides; and
the anhydride being acetic anhydride.

Methods of selectively etching films from substrates are disclosed. A vapor of a halide-containing compound is pulsed into a chamber containing the substrate having the film disposed thereon. Plasma is ignited in the chamber during the halide-containing compound pulse. The vapor of a volatile organic compound is pulsed into the chamber. The disclosed methods may include one or more of the following aspects:
removing native oxide from the film by sputtering with argon plasma prior to pulsing of the vapor of the halide-containing compound;
sputtering the film with argon plasma prior to pulsing of the vapor of the halide-containing compound;
further comprising igniting a plasma during the volatile organic compound pulse;
repeating the halide-containing compound pulse, ignition, and volatile organic compound pulse steps;
further comprising repeating the volatile organic compound pulse step;
wherein performing the halide-containing compound pulse, ignition, and volatile organic compound pulse steps one time etches one atomic layer of the film;
the substrate being a silicon-containing substrate;
the substrate being a low k layer;
the substrate being SiN;
the substrate being a metal-containing substrate;
the substrate being Co;
the substrate being Ni;
the film being selected from the group consisting of Ti-containing films, Ta-containing films, W-containing films, and Al-containing films; the Ti-containing film being Ti;
the Ti-containing film being $TiN_xO_y$, wherein x ranges from 0.1 to 2 and y ranges from 0 to 1;
the Ta-containing film being Ta;
the film being $TaN_xO_y$, wherein x ranges from 0.1 to 2 and y ranges from 0 to 0.5;
the W-containing film being W;
the W-containing film being $WN_xO_y$, wherein x and y each independently ranges from 0 to 2;
the Al-containing film being Al;
the Al-containing film being $AlCu_x$, wherein x ranges from 0 to 8;
the film being an alkaline earth metal layer;
the alkaline earth metal layer being a Mg layer;
the film being a transition metal layer;
the transition metal layer being selected from the group consisting of Zr, Ta, Cr, Mn, Fe, Ru, Co, Ir, Ni, Pd, Pt, Cu, Au, alloy thereof, oxides thereof, nitrides thereof, and combinations thereof;
the transition metal layer being a Zr layer;
the transition metal layer being a Ta layer;
the transition metal layer being a Cr layer;
the transition metal layer being a Mn layer;
the transition metal layer being a Fe layer;
the transition metal layer being a Ru layer;
the transition metal layer being a Co layer;
the transition metal layer being a Ir layer;
the transition metal layer being a Ni layer;
the transition metal layer being a Pd layer;

the transition metal layer being a Pt layer;
the transition metal layer being a Cu layer;
the transition metal layer being a Au layer;
the film being a metalloid layer;
the metalloid layer being a B layer;
the metalloid layer being a Si layer;
the halide-containing compound being selected from the group consisting of $Cl_2$, HCl, $SOCl_2$, $Br_2$, $I_2$, $BCl_3$, $BBr_3$, $SO_2Cl_2$, FCl, $ClF_3$, HBr, HI, $F_2$, HF, $NF_3$, $POCl_3$, $CF_4$, $CHF_3$, $SF_6$, $CCl_4$, $CF_3I$, $CF_3Cl$, and $CF_3Br$;
the halide-containing compound being $Cl_2$;
the halide-containing compound being HCl;
the halide-containing compound being $SOCl_2$;
the halide-containing compound being $Br_2$;
the halide-containing compound being $I_2$;
the halide-containing compound being $BCl_3$;
the halide-containing compound being $BBr_3$;
the halide-containing compound being $SO_2Cl_2$;
the halide-containing compound being FCl;
the halide-containing compound being $ClF_3$;
the halide-containing compound being HBr;
the halide-containing compound being HI;
the halide-containing compound being $F_2$;
the halide-containing compound being HF;
the halide-containing compound being $NF_3$;
the halide-containing compound being $POCl_3$;
the halide-containing compound being $CF_4$;
the halide-containing compound being $CHF_3$;
the halide-containing compound being $SF_6$;
the halide-containing compound being $CCl_4$;
the halide-containing compound being $CF_3I$;
the halide-containing compound being $CF_3Cl$;
the halide-containing compound being $CF_3Br$;
the volatile organic compound consisting of the elements C, F, H, N, O, or combinations thereof;
the volatile organic compound being selected from the group consisting of alcohols, ethers, amines, amidinates, hydrazines, diketones, carboxylic acids, aldehydes, ketoimines, diketimines, bis(silyl)amides, and anhydrides;
the volatile organic compound being an oxygen-containing compound;
the volatile organic compound being a nitrogen-containing compound;
the volatile organic compound being an alcohol;
the alcohol being methanol, ethanol, or isopropanol;
the alcohol being ethanol;
the volatile organic compound being an ether;
the ether being dimethyl ether or diethyl ether;
the volatile organic compound being an amine;
the amine being methylamine, dimethylamine, ethylamine, diethylamine, isopropylamine, or diisopropylamine;
the volatile organic compound being an amidinate;
the volatile organic compound being N,N'-bis(1-methylethyl)ethanimidamide;
the volatile organic compound being a hydrazine;
the hydrazine being $Me_2NNMe_2$ or $Et_2NNH_2$;
the volatile organic compound being a diketone;
the diketone being acetyl acetone or hexafluoroacetylacetone;
the diketone being acetyl acetone;
the volatile organic compound being a carboxylic acid;
the carboxylic acid being acetic acid;
the volatile organic compound being an aldehyde;
the aldehyde being formaldehyde or acetaldehyde;
the volatile organic compound being a ketoimines;
the ketoimine being 4-ethylamino-pent-3-en-2-one;
the volatile organic compound being a diketimine;
the diketimine being N,N-diethylpentadiamine;
the volatile organic compound being a bis(silyl)amides;
the bis(silyl)amide having the formula $R_3Si$—NH—$SiR_3$, wherein each R is independently selected from a C1 to C5 alkyl group;
the bis(silyl)amide being bis(trimethylsilyl)amide;
the volatile organic compound being an anhydrides; and
the anhydride being acetic anhydride.

Methods of removing films from substrates are disclosed. The substrate is sputtered with argon plasma. The vapor of a volatile organic compound is introduced into the chamber. The chamber is purged. The disclosed methods may include one or more of the following aspects:
further comprising igniting a plasma during the volatile organic compound introduction step;
repeating the sputtering, volatile organic compound introduction, and purging steps;
repeating the volatile organic compound introduction and purging steps;
wherein performing the sputtering, volatile organic compound introduction, and purging steps one time removes one atomic layer of the film;
the substrate being a silicon-containing substrate;
the substrate being a low k layer;
the substrate being SiN;
the substrate being a metal-containing substrate;
the substrate being Co;
the substrate being Ni;
the film being selected from the group consisting of Ti-containing films, Ta-containing films, W-containing films, and Al-containing films;
the Ti-containing film being Ti;
the Ti-containing film being $TiN_xO_y$, wherein x ranges from 0.1 to 2 and y ranges from 0 to 1;
the Ta-containing film being Ta;
the film being $TaN_xO_y$, wherein x ranges from 0.1 to 2 and y ranges from 0 to 0.5;
the W-containing film being W;
the W-containing film being $WN_xO_y$, wherein x and y each independently ranges from 0 to 2;
the Al-containing film being Al;
the Al-containing film being $AlCu_x$, wherein x ranges from 0 to 8;
the film being an alkaline earth metal layer;
the alkaline earth metal layer being a Mg layer;
the film being a transition metal layer;
the transition metal layer being selected from the group consisting of Zr, Ta, Cr, Mn, Fe, Ru, Co, Ir, Ni, Pd, Pt, Cu, Au, alloy thereof, oxides thereof, nitrides thereof, and combinations thereof;
the transition metal layer being a Zr layer;
the transition metal layer being a Ta layer;
the transition metal layer being a Cr layer;
the transition metal layer being a Mn layer;
the transition metal layer being a Fe layer;
the transition metal layer being a Ru layer;
the transition metal layer being a Co layer;
the transition metal layer being a Ir layer;
the transition metal layer being a Ni layer;
the transition metal layer being a Pd layer;
the transition metal layer being a Pt layer;
the transition metal layer being a Cu layer;
the transition metal layer being a Au layer;
the film being a metalloid layer;

the metalloid layer being a B layer;
the metalloid layer being a Si layer;
the halide-containing compound being selected from the group consisting of $Cl_2$, HCl, $SOCl_2$, $Br_2$, $I_2$, $BCl_3$, $BBr_3$, $SO_2Cl_2$, FCl, $ClF_3$, HBr, HI, $F_2$, HF, $NF_3$, $POCl_3$, $CF_4$, $CHF_3$, $SF_6$, $CCl_4$, $CF_3I$, $CF_3Cl$, and $CF_3Br$;
the halide-containing compound being $Cl_2$;
the halide-containing compound being HCl;
the halide-containing compound being $SOCl_2$;
the halide-containing compound being $Br_2$;
the halide-containing compound being $I_2$;
the halide-containing compound being $BCl_3$;
the halide-containing compound being $BBr_3$;
the halide-containing compound being $SO_2Cl_2$;
the halide-containing compound being FCl;
the halide-containing compound being $ClF_3$;
the halide-containing compound being HBr;
the halide-containing compound being HI;
the halide-containing compound being $F_2$;
the halide-containing compound being HF;
the halide-containing compound being $NF_3$;
the halide-containing compound being $POCl_3$;
the halide-containing compound being $CF_4$;
the halide-containing compound being $CHF_3$;
the halide-containing compound being $SF_6$;
the halide-containing compound being $CCl_4$;
the halide-containing compound being $CF_3I$;
the halide-containing compound being $CF_3Cl$;
the halide-containing compound being $CF_3Br$;
the volatile organic compound consisting of the elements C, F, H, N, O, or combinations thereof;
the volatile organic compound being selected from the group consisting of alcohols, ethers, amines, amidinates, hydrazines, diketones, carboxylic acids, aldehydes, ketoimines, diketimines, bis(silyl)amides, and anhydrides;
the volatile organic compound being an alcohol;
the alcohol being methanol, ethanol, or isopropanol;
the alcohol being ethanol;
the volatile organic compound being an ether;
the ether being dimethyl ether or diethyl ether;
the volatile organic compound being an amine;
the amine being methylamine, dimethylamine, ethylamine, diethylamine, isopropylamine, or diisopropylamine;
the volatile organic compound being an amidinate;
the volatile organic compound being N,N'-bis(1-methylethyl)ethanimidamide;
the volatile organic compound being a hydrazine;
the hydrazine being $Me_2NNMe_2$ or $Et_2NNH_2$;
the volatile organic compound being a diketone;
the diketone being acetyl acetone or hexafluoroacetylacetone;
the diketone being acetyl acetone;
the volatile organic compound being a carboxylic acid;
the carboxylic acid being acetic acid;
the volatile organic compound being an aldehyde;
the aldehyde being formaldehyde or acetaldehyde;
the volatile organic compound being a ketoimines;
the ketoimine being 4-ethylamino-pent-3-en-2-one;
the volatile organic compound being a diketimine;
the diketimine being N,N-diethylpentadiamine;
the volatile organic compound being a bis(silyl)amides;
the bis(silyl)amide having the formula $R_3Si$—NH—$SiR_3$, wherein each R is independently selected from a C1 to C5 alkyl group;
the bis(silyl)amide being bis(trimethylsilyl)amide;
the volatile organic compound being an anhydrides; and
the anhydride being acetic anhydride.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 16 is a spectrum obtained by EDS of a 8 mm×8 mm Si substrate containing an approximately 15 nm Ti layer and an approximately 100 nm Fe layer thereon (the "Fe sample") before etching;

FIG. 17 is a spectrum obtained by EDS of the Fe sample after exposure to 15 cycles of $Cl_2$ with plasma followed by ethanol with plasma;

FIG. 18 is a spectrum obtained by EDS of the Fe sample after exposure to 30 cycles of $Cl_2$ with plasma followed by ethanol with plasma;

FIG. 19 is a spectrum obtained by EDS of the Fe sample after exposure to 45 cycles of $Cl_2$ with plasma followed by ethanol with plasma;

FIG. 20 is a spectrum obtained by EDS of the Fe sample after exposure to 74 cycles of $Cl_2$ with plasma followed by ethanol with plasma;

FIG. 21 is a spectrum obtained by EDS of a comparative Fe sample subject to 100 cycles of plasma $Cl_2$;

FIG. 22 is a spectrum obtained by EDS of the Pd layer before etching;

FIG. 23 is a spectrum obtained by EDS of the Pd sample after exposure to 15 cycles of $Cl_2$ with plasma followed by ethanol with plasma;

FIG. 24 is a spectrum obtained by EDS of the Pd sample after exposure to 30 cycles of $Cl_2$ with plasma followed by ethanol with plasma;

FIG. 25 is a spectrum obtained by EDS of the Pd sample after exposure to 45 cycles of $Cl_2$ with plasma followed by ethanol with plasma;

FIG. 26 is a spectrum obtained by EDS of the Pd sample after exposure to 74 cycles of $Cl_2$ with plasma followed by ethanol with plasma;

FIG. 27 is a spectrum obtained by EDS of a comparative Pd sample subject to 100 cycles of plasma $Cl_2$;

DETAILED DESCRIPTION OF PREFERRED EMBODIMENTS

Methods of removing a layer from a substrate are disclosed. More particularly, methods of removing sacrificial mask materials from substrates are disclosed. Alternatively, methods of removing metal layers from substrates are disclosed. The metal layer or sacrificial mask material is etched or selectively etched from a substrate. The metal layer or sacrificial mask material may also be removed from the chamber walls or other surfaces in the chamber.

Figure 1:
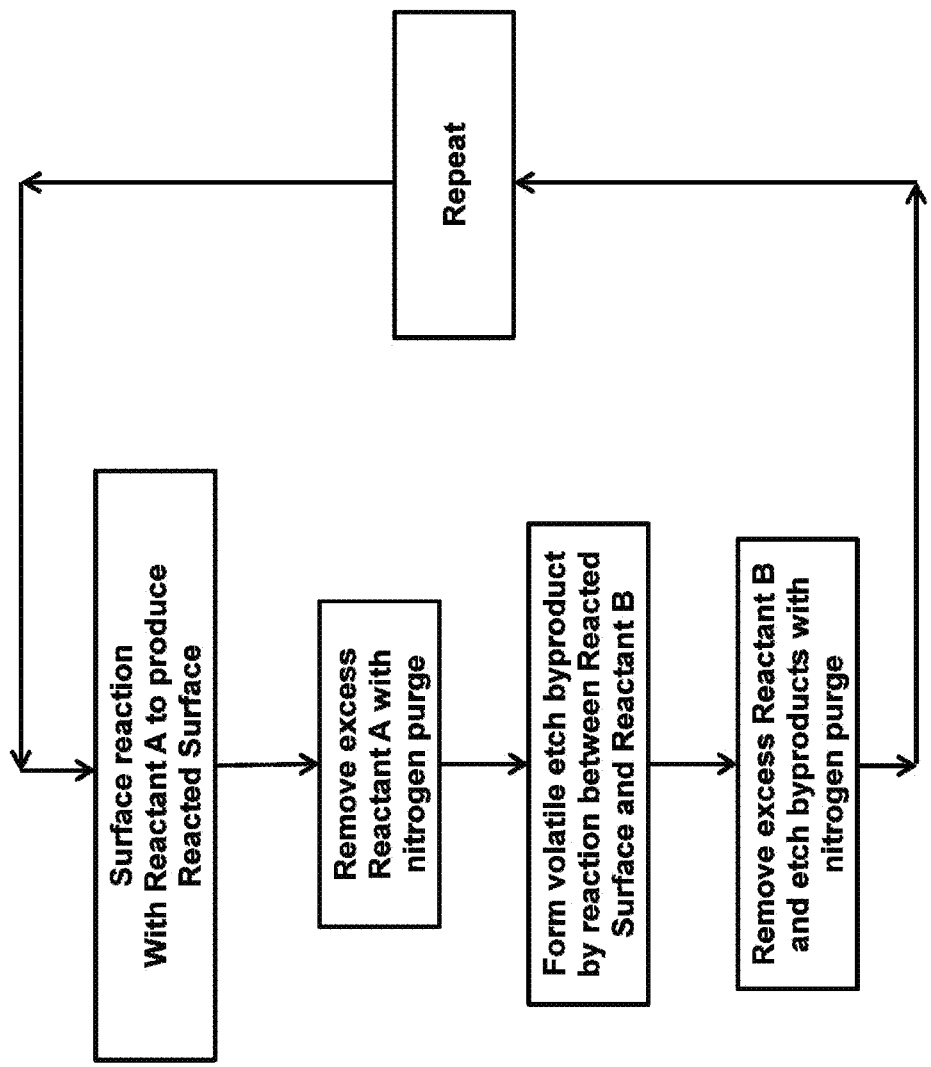
FIG. 1 is a schematic diagram of the atomic layer etch process disclosed herein.

As illustrated in FIG. 1, the disclosed methods remove the layer by repetition of a cycle of pulsing a plasma containing a halide-containing compound (Plasma Reactant A) over the layer followed by pulsing a volatile organic compound (Reactant B) over the layer. A plasma may or may not be ignited for the volatile organic compound pulse. One of ordinary skill in the art will recognize that either the halide-containing compound pulse or the volatile organic compound pulse may start the cycle without departing from the teachings herein. Applicants believe that one cycle may remove one atomic layer (i.e., atomic layer etching) of the layer when the process parameters are optimized. Sufficient repetition of the cycles removes the entire layer.

Suitable layers may include sacrificial mask materials or metal layers. Exemplary sacrificial mask materials include Ti-, Ta-, W-, or Al-containing layers. Exemplary metal layers include Pd, Ir, Co, Fe, B, Cu, Ni, Pt, Ru, Mn, Mg, Cr, Au, alloys thereof, oxides thereof, nitrides thereof, and combinations thereof. The sacrificial mask material may be used to form a patterning layer. The metal layer may be used to form a MRAM device stack.

The mask material may be any Ti-containing films, Ta-containing films, W-containing films, or Al-containing films. These layers are currently used as hard marks, although other functions are not excluded from the scope of this application. Exemplary Ti-containing films include Ti or $TiN_xO_y$, wherein x ranges from 0.1 to 2 and y ranges from 0 to 1. Exemplary Ta-containing films include Ta or $TaN_xO_y$, wherein x ranges from 0.1 to 2 and y ranges from 0 to 0.5. Exemplary W-containing films include W or $WN_xO_y$, wherein x and y each independently ranges from 0 to 2. Exemplary Al-containing films include Al or $AlCu_x$, wherein x ranges from 0 to 8. The layer or mask material may be sputter cleaned with Ar plasma to remove native oxide from the top layer at the beginning of the process.

The layer may serve as a sacrificial mask layer to permit patterning of other layers on the substrate. As a result, the layer is resistant to the chemicals used to etch the other layers on the substrate. After the patterning is complete, removal of the sacrificial mask layer may be necessary. However, removal of the layer may be difficult because of its chemical resistant properties. Typically, removal of the mask layer has required use of liquid phase solvents, which can damage the remaining structures on the substrate, for example by creating sticktion force in small trenches that distort structures. One of ordinary skill in the art will recognize that the chemically resistant layer may also form on the reactor walls. As a result, the methods disclosed herein are not limited to removal of layers from semiconductor wafers, and instead may also be used to remove layers from chamber walls.

Figure 2A:
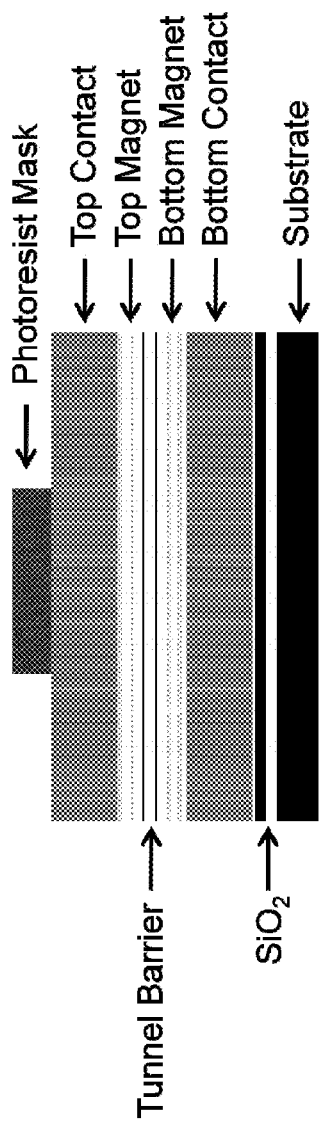
FIG. 2a is a diagram showing exemplary layers in a MRAM stack.
Figure 2B:
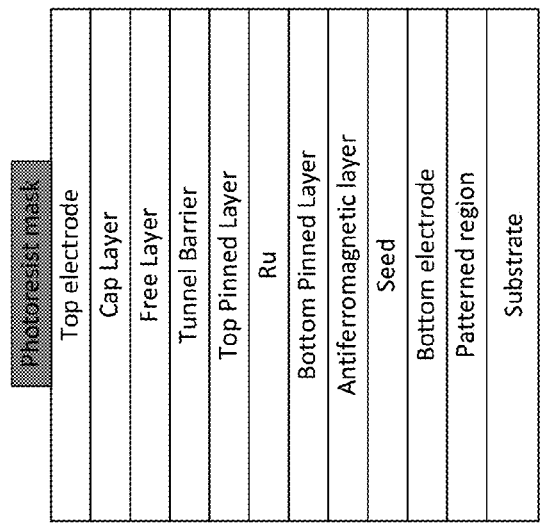
FIG. 2b is a diagram showing exemplary layers in an alternate MRAM stack.
Figure 2C:
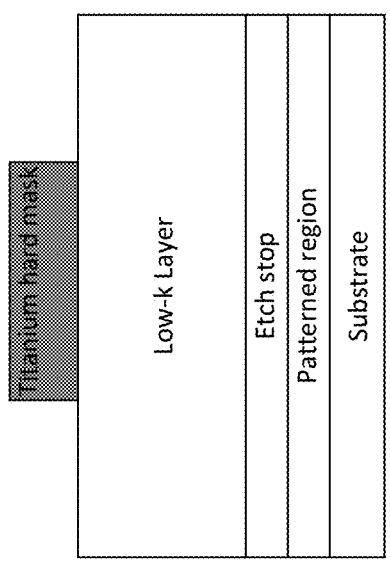
FIG. 2c is a diagram showing exemplary layers used in patterning in back end of the line (BEOL)

FIGS. 2a-2c provide three alternate diagrams showing exemplary layers in a MRAM stack. One of ordinary skill in the art will recognize that the MRAM stack may contain additional or fewer layers depending on the MRAM cell desired. The photoresist mask layer of FIG. 2a-2c may be any of the mask layers discussed above. As shown in FIG. 2c, the photoresist mask layer may be a titanium containing hard mask. The top and bottom contact (FIG. 2a) or electrode (FIG. 2b) layers may be Au, Cr, Cu, Ti, Ta, Ru, or combinations thereof. The top and bottom magnet of FIG. 2a may be B, Co, Fe, Ni, and combinations thereof. The tunnel barrier layer of FIGS. 2a and 2b may be AlO, Cu or MgO. The substrate of FIGS. 2a-2c may be Si. The cap layer of FIG. 2b may be PtMn, AlO, MgO, Ru, Ta, or TaN. The free layer and top and bottom pinned layers of FIG. 2b may be ferromagnetic metals, such as CoFeB or NiFe. Ru forms a non-magnetic spacer layer in FIG. 2b. The antiferromagnetic layer of FIG. 2b may be PtMn or IrMn. The seed layer of FIG. 2b may be NiFe, NiFeCu, or Cu. The patterned region of FIG. 2b may be the phosphosilicate glass layer containing tungsten, copper, or other metal contacts used in the transistor region. The low k layer of FIG. 2c may be any silicon containing low k layer, such as $SiO_2$, SiCOH, etc. The etch stop layer of FIG. 2c may be SiC or SiN. The patterned region of FIG. 2c may be the phosphosilicate glass layer containing tungsten, copper, or other metal contacts used in the front end of the line (FEOL) or middle of the line (MOL) transistor region. Alternatively, the patterned region of FIG. 2c may be the low k layer containing copper contacts used in the back end of the line (BEOL) interconnect region. The multiple layers that form MRAM materials are difficult to etch. The disclosed processes provide the capability to select the proper halide-containing compound and/or volatile organic compound to sequentially remove one atomic layer of each metal layer in the MRAM stack. Applicants believe that the proposed cyclic etching processes may serve as a "reverse ALD" technique. In other words, the proposed cyclic etching process may be able to re-generate the volatile precursor that had originally been used to deposit the metal layer and easily remove it from the etch chamber.

The vapor of a halide-containing compound is introduced into a chamber containing the substrate having the layer disposed thereon. The halide-containing compound may be $Cl_2$, HCl, $SOCl_2$, $Br_2$, $I_2$, $BCl_3$, $BBr_3$, $SO_2Cl_2$, FCl, $ClF_3$, HBr, HI, $F_2$, HF, $NF_3$, $POCl_3$, $CF_4$, $CHF_3$, $SF_6$, $CCl_4$, $CF_3I$, $CF_3Cl$, $CF_3Br$ and combinations thereof. These halide-containing compounds are either commercially available or may be synthesized by methods known in the art.

In order to prevent surface changes on the substrate or any other process inconsistencies, purity of the halide-containing compound is between approximately 99.99% v/v and 100% v/v, preferably 99.999% v/v and 100% v/v. The concentration of $O_2$ in the halide-containing compound is preferably between approximately 0 ppmv and approximately 50 ppmv, preferably between approximately 0 ppmv and approximately 4 ppmv, and more preferably between approximately 0 ppmv and approximately 1 ppmv. The concentration of $H_2O$ in the halide-containing compound is preferably between approximately 0 ppmv and approximately 10 ppmv, preferably between approximately 0 ppmv and approximately 2 ppmv, and more preferably between approximately 0 ppmv and approximately 1 ppmv.

The chamber may be any enclosure or chamber within a device in which plasma etching methods take place such as, and without limitation, Reactive Ion Etching (RIE), Dual Capacitively Coupled Plasma (CCP) with single or multiple frequency RF sources, Inductively Coupled Plasma (ICP), or Microwave Plasma reactors, or other types of etching systems capable of selectively removing a portion of the layer by generating active species. The plasma may be generated or present within the reactor itself. Alternatively, the plasma may generally be at a location removed from the reactor, for instance, in a remotely located plasma system. One of skill in the art will recognize the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher Dielectric etch product family sold under the trademark 2300® Flex™.

The plasma reaction chamber may contain one or more than one substrate. For example, the substrate may be any component part of the plasma reaction chamber, such as passivated or non-passivated alumina, aluminum, ceramic, quartz, steel, SiC, SiN, SiCN, or Teflon® coating material sold by E.I. Du Pont de Nemours and Company. Alternatively, the plasma reaction chamber may contain from 1 to 200 silicon wafers having from 25.4 mm to 450 mm diameters. The one or more substrates may be any suitable substrate used in semiconductor, photovoltaic, flat panel or LCD-TFT device manufacturing. As discussed above with regards to FIGS. 2a-2c, the substrate may have multiple films or layers thereon, including one or more silicon-containing films or layers. The substrate may or may not be patterned. Examples of suitable layers include without limitation silicon (such as amorphous silicon, polysilicon, crystalline silicon, any of which may further be p-doped or n-doped with B, C, P, As, and/or Ge), silica, silicon nitride, silicon oxide, silicon oxynitride, tungsten, titanium nitride, tantalum nitride, mask materials such as amorphous carbon, antireflective coatings, photoresist materials, or combinations thereof. The silicon oxide layer may form a dielectric material, such as an organic based or silicon oxide based low-k dielectric material (e.g., a porous SiCOH film). An exemplary low-k dielectric material is sold by Applied Materials under the trade name Black Diamond II or III. Additionally, layers comprising tungsten or noble metals (e.g. platinum, palladium, rhodium or gold) may be used.

The substrate temperature of the chamber may range from approximately –50° C. to approximately 400° C., preferably from approximately 25° C. to approximately 250° C. The chamber wall may be hot or cold (i.e., from approximately 25° C. to approximately 400° C.). The pressure of the chamber may range from approximately 1 mTorr to atmospheric pressure (760 Torr), preferably from approximately 1 mTorr to 15 Torr.

The halide-containing compounds may be in gas, liquid, or solid form at standard temperature and pressure. As the term "gas" is synonymous with the term "vapor," the gas compounds may be directly introduced into the chamber.

If in liquid form, the halide-containing compound may be supplied either in neat form or in a blend with a suitable solvent, such as ethyl benzene, xylene, mesitylene, decane, dodecane. The halide-containing liquids may be present in varying concentrations in the solvent. One or more of the neat or blended halide-containing liquids are introduced into a reactor in vapor form by conventional means, such as tubing and/or flow meters. The vapor form of the halide-containing liquid may be produced by vaporizing the neat or blended compound solution through a conventional vaporization step such as direct vaporization, distillation, or by bubbling. The neat or blended liquid may be fed in liquid state to a vaporizer where it is vaporized before it is introduced into the reactor. Alternatively, the neat or blended liquid may be vaporized by passing a carrier gas into a container containing the compound or by bubbling the carrier gas into the compound. The carrier gas may include, but is not limited to, Ar, He, $N_2$, and mixtures thereof. Bubbling with a carrier gas may also help remove any dissolved oxygen present in the neat or blended compound solution. The carrier gas and halide-containing compound are then introduced into the reactor as a vapor.

The vapour of a solid halide-containing compound may be supplied using a sublimator, such as the one disclosed in PCT Publication WO2009/087609 to Xu et al. Alternatively, the solid halide-containing compound may be blended with a suitable solvent, such as ethyl benzene, xylene, mesitylene, decalin, decane, dodecane. The halide-containing compound may be present in varying concentrations in the solvent.

If necessary, the container of the halide-containing compound may be heated to a temperature that permits the compound to have sufficient vapor pressure in its gas, liquid, or solid phase. The container may be maintained at temperatures in the range of, for example, approximately 0° C. to approximately 150° C. Those skilled in the art recognize that the temperature of the container may be adjusted in a known manner to control the amount of compound vaporized.

The vapor of the halide-containing compound is introduced into the plasma reaction chamber containing the substrate. The vapor may be introduced to the chamber at a flow rate ranging from approximately 0.1 sccm to approximately 1 slm. For example, for a 200 mm wafer size, the vapor may be introduced to the chamber at a flow rate ranging from approximately 5 sccm to approximately 50 sccm. Alternatively, for a 450 mm wafer size, the vapor may be introduced to the chamber at a flow rate ranging from approximately 25 sccm to approximately 250 sccm. One of ordinary skill in the art will recognize that the flow rate will vary from tool to tool.

An inert gas is also introduced into the plasma reaction chamber in order to sustain the plasma. The inert gas may be He, Ar, Xe, Kr, Ne, or combinations thereof. The halide-containing compound and the inert gas may be mixed prior to introduction to the chamber, with the inert gas comprising between approximately 0.1% v/v and approximately 99.9% v/v of the resulting mixture. Alternatively, the inert gas may be introduced to the chamber continuously while short sprays of the halide-containing compound are introduced to the chamber.

The halide-containing compound may be disassociated into radical form using a plasma. The plasma may be ignited in the chamber containing the halide-containing compound. Alternatively, the halide-containing compound may be dis-associated using a remote plasma system. The plasma may be generated by applying RF or DC power. The plasma may be generated with a RF power ranging from about 25 W to about 10,000 W. The plasma may be generated in Dual CCP or ICP mode with RF applied at both electrodes. RF frequency of plasma may range from 200 KHz to 1 GHz. Different RF sources at different frequency can be coupled and applied at the same electrode. Plasma RF pulsing may be further used to control molecule fragmentation and reaction at substrate. One of skill in the art will recognize methods and apparatus suitable for such plasma treatment.

Quadropole mass spectrometer (QMS), optical emission spectrometer, FTIR, or other radical/ion measurement tools may measure the activated halide-containing compound to determine the types and numbers of species produced. If necessary, the flow rate of the halide-containing compound and/or the inert gas may be adjusted to increase or decrease the number of radical species produced.

The plasma may be maintained for a certain duration, which may be optimized based on the characteristics of the layer to be removed. Applicants believe that the halide-containing compound reacts with the layer to form an activated layer. The chamber is purged of any unreacted halide-containing compound and volatile reaction products.

The vapor of a volatile organic compound is introduced into the chamber. The volatile organic compound may be alcohols, ethers, amines, hydrazines, diketones, carboxylic acids, aldehydes, ketoimines, diketimines, bis(silyl)amides, anhydrides, or combinations thereof. These volatile organic compounds are either commercially available or may be synthesized by methods known in the art.

The volatile organic compounds may be in gas, liquid, or solid form at standard temperature and pressure. As the term "gas" is synonymous with the term "vapor," the gas compounds may be directly introduced into the chamber.

If in liquid form, the volatile organic compound may be supplied either in neat form or in a blend with a suitable solvent, such as ethyl benzene, xylene, mesitylene, decane, or dodecane. The liquid volatile organic compounds may be present in varying concentrations in the solvent. One or more of the neat or blended liquid volatile organic compounds are introduced into a reactor in vapor form by conventional means, such as tubing and/or flow meters. The vapor form of the liquid volatile organic compound may be produced by vaporizing the neat or blended compound solution through a conventional vaporization step such as direct vaporization, distillation, or by bubbling. The neat or blended liquid may be fed in liquid state to a vaporizer where it is vaporized before it is introduced into the reactor. Alternatively, the neat or blended liquid may be vaporized by passing a carrier gas into a container containing the compound or by bubbling the carrier gas into the compound. The carrier gas may include, but is not limited to, Ar, He, $N_2$, and mixtures thereof. Bubbling with a carrier gas may also help remove any dissolved oxygen present in the neat or blended compound solution. The carrier gas and volatile organic compound are then introduced into the reactor as a vapor.

The vapour of the solid volatile organic compound may be supplied using a sublimator, such as the one disclosed in PCT Publication WO2009/087609 to Xu et al. Alternatively, the solid volatile organic compound may be blended with a suitable solvent, such as ethyl benzene, xylene, mesitylene, decalin, decane, dodecane. The volatile organic compound may be present in varying concentrations in the solvent.

If necessary, the container of the volatile organic compound may be heated to a temperature that permits the compound to have sufficient vapour pressure in its gas, liquid, or solid phase. The container may be maintained at temperatures in the range of, for example, approximately 0° C. to approximately 150° C. Those skilled in the art recognize that the temperature of the container may be adjusted in a known manner to control the amount of compound vaporized.

In one alternative, the volatile organic compound is an oxygen-containing compound. Applicants believe that, due to the oxophilic nature of Ti, the oxygen molecule will react with activated surface in the mask layer to produce a volatile M-O—R compound, with M being Ti, Ta, W, or Al, and R being any ligand from the oxygen-containing compound. The volatile M-O—R compound will then be easily removed from the chamber. The oxygen-containing compounds may be alcohols, ethers, diketones, carboxylic acids, aldehydes, anhydrides, ketoimines, or combinations thereof. Exemplary alcohols include methanol, ethanol, isopropanol, and mixtures thereof. Exemplary ethers include dimethyl ether or diethyl ether. Exemplary diketones include acetyl acetone and hexafluoroacetylacetone. Preferably, the diketone is acetyl acetone. Exemplary carboxylic acids include acetic acid. Exemplary aldehydes include formaldehyde or acetaldehyde. Exemplary anhydrides include acetic anhydride. Exemplary enaminoketones include 4-ethylamino-pent-3-en-2-one.

In another alternative, the volatile organic compound is a nitrogen-containing compound. Applicants believe, due to the affinity of M for N, that the nitrogen-containing compound will react with activated surface in the mask layer to produce a volatile M-N—R compound, with M being Ti, Ta, W, or Cu, and R being any ligand from the nitrogen-containing compound. The volatile M-N—R compound will then be easily removed from the chamber. The nitrogen-containing compounds may be amines, amidinates, hydrazines, ketoimines, diketimines, bis(silyl)amides, or combinations thereof. Exemplary amines include methylamine, dimethylamine, ethylamine, diethylamine, isopropylamine, and diisopropylamine. Exemplary amidinates include N,N'-bis(1-methylethyl)-ethanimidiamide (CAS 106500-93-0). Exemplary hydrazines include $Me_2NNMe_2$ or $Et_2NNH_2$. Exemplary ketoimines include 4-ethylamino-pent-3-en-2-one. Exemplary diketimines include N,N-diethylpentadi-amine. Exemplary bis(silyl)amides have the formula $R_3Si$—NH—$SiR_3$, wherein each R is independently selected from a C1 to C5 alkyl group. One preferred bis(silyl)amide is bis(trimethylsilyl)amide.

In order to prevent surface changes on the substrate or any other process inconsistencies, purity of the volatile organic compound is between approximately 99.99% v/v and approximately 100% v/v, preferably approximately 99.999% v/v and approximately 100% v/v. The concentration of $O_2$ in the volatile organic compound is preferably between approximately 0 ppmv and approximately 50 ppmv, preferably between approximately 0 ppmv and approximately 4 ppmv, and more preferably between approximately 0 ppmv and approximately 1 ppmv. The concentration of $H_2O$ in the volatile organic compound is preferably between approximately 0 ppmv and approximately 10 ppmv, preferably between approximately 0 ppmv and approximately 2 ppmv, and more preferably between approximately 0 ppmv and approximately 1 ppmv.

The vapor of the volatile organic compound is introduced into the plasma reaction chamber containing the substrate. The vapor may be introduced to the chamber at a flow rate ranging from approximately 0.1 sccm to approximately 1 slm. For example, for a 200 mm wafer size, the vapor may be introduced to the chamber at a flow rate ranging from approximately 5 sccm to approximately 50 sccm. Alternatively, for a 450 mm wafer size, the vapor may be introduced to the chamber at a flow rate ranging from approximately 25 sccm to approximately 250 sccm. One of ordinary skill in the art will recognize that the flow rate will vary from tool to tool.

In one alternative, the disclosed volatile organic compounds may be used to react with and remove the activated layer in a thermal process. In this process, the substrate is kept at a high temperature (approximately −50° C. to approximately 400° C.). These temperatures may be sufficient to allow the vapor of the volatile organic compounds and the activated layer to react and produce volatile byproducts.

In another alternative, the disclosed volatile organic compounds may be used to remove the activated layer in a plasma process. The vapor of the volatile organic compound may be disassociated into radical form using a plasma. The plasma may be ignited in the chamber containing the volatile organic compound. Alternatively, the volatile organic compound may be disassociated using a remote plasma system. In this process, an inert gas is also used in order to sustain the plasma. The inert gas may be He, Ar, Xe, Kr, Ne, or combinations thereof. The volatile organic compound and the inert gas may be mixed prior to introduction to the chamber, with the inert gas comprising between approximately 50% v/v and approximately 95% v/v of the resulting mixture. Alternatively, the inert gas may be introduced to the chamber continuously while short sprays of the volatile organic compound are introduced to the chamber. As discussed with respect to the halide-containing compound, the plasma may be ignited by applying RF or DC power. Alternatively, no plasma may be used, particularly when the volatile organic compound is sufficiently reactive so that no plasma is required.

The plasma may be maintained for a certain duration, which may be optimized based on the characteristics of the activated layer to be removed. Applicants believe that the volatile organic compound reacts with the activated layer. The chamber is purged of any unreacted volatile organic compound and any volatile reaction products.

The disclosed processes preferably selectively etch the metal layer or mask material from surrounding silicon-containing, such as low k or SiN, or metal conducting layers, such as Co or Ni. The disclosed processes will be much more economically friendly than the prior liquid etch processes because they may be performed in the same chamber where vapor deposition and other vapor etch processes are performed. The disclosed processes may also result in faster throughput. Alternatively, the disclosed processes may provide discrete self-limiting steps providing infinite selectively between the layer being etched and its surrounding layers. The disclosed process may solve the metal etching challenges in vacuum environment, with currently available solutions limited to sputtering or Ion milling

EXAMPLES

The following non-limiting examples are provided to further illustrate embodiments of the invention. However, the examples are not intended to be all inclusive and are not intended to limit the scope of the inventions described herein.

Figure 3:
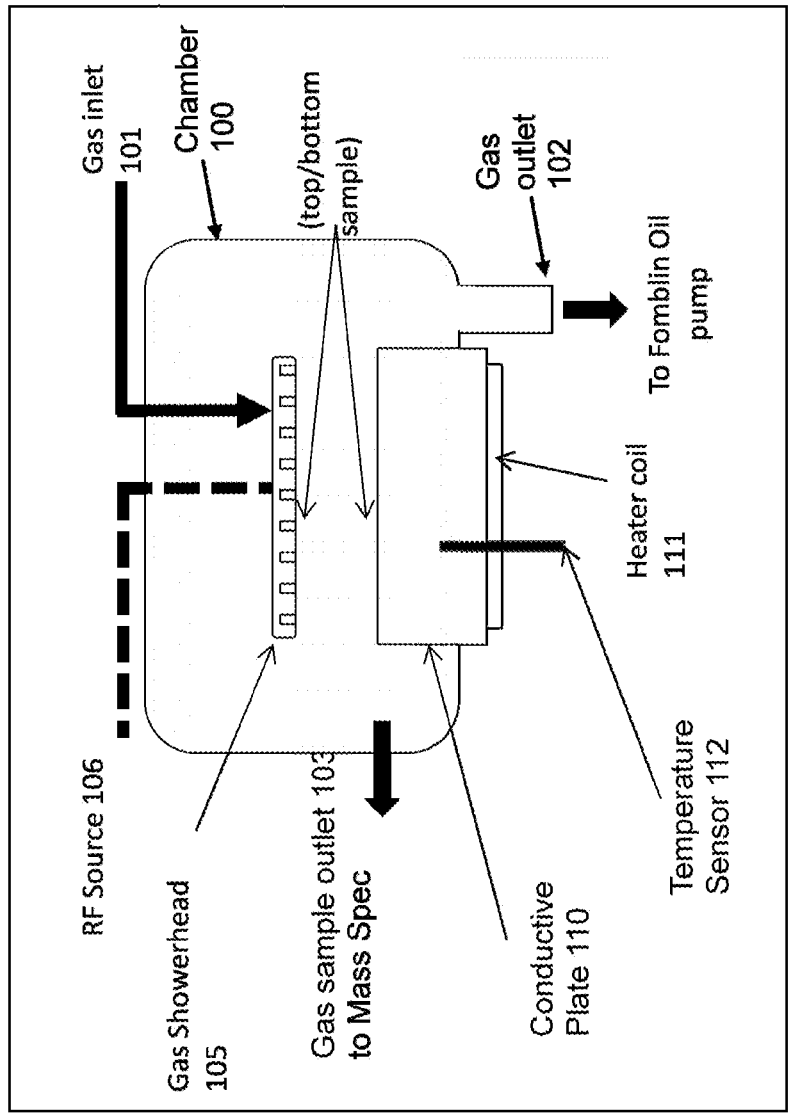
FIG. 3 is a diagram of the experimental chamber used to perform the testing disclosed in the examples.

The test results in comparative examples 1-5 and examples 1-3 and 5 that follow were obtained using the R&D chamber 100 illustrated in FIG. 3. The test results in comparative examples 6 and 7 and example 4 were obtained using the R&D chamber 100 illustrated in FIG. 29. The chambers 100 include a gas showerhead 105 and a thermally conductive plate 110. A gas inlet 101 and an RF source 106 are connected to the gas showerhead 105 in FIG. 3. The RF source 106 is connected to the conductive plate in FIG. 29. A heater 111 and temperature sensor 112 are connected to the thermally conductive plate 110. The chamber 100 also includes a gas outlet 102. The gas outlet 102 is connected to a pump (not shown). A gas sample outlet 103 is also located in the chamber 100 and connected to a mass spectrometer (not shown) for analysis of gas species in the chamber 100. Double sided carbon tape (not shown) was used to adhere an approximately 8 mm×8 mm Si substrate to the showerhead 105 (the "top sample T"). An approximately 8 mm×8 mm Si substrate was placed on the thermally conductive plate 110 (the "bottom sample B"). A TiN layer approximately 55 nm thick was used for each of T and B in Comparative Examples 1-5 and Examples 1, 2 and 5. Pressure in the chamber 100 was maintained from 0.2 Torr to 0.6 Torr during the etch processes and at ~1 Torr during the nitrogen purge. The walls of the chamber 100 and showerhead 105 are cooled by water to approximately 22° C., although the thermally conductive plate 110 was heated to high enough temperatures to heat the walls and showerhead 105 above 22° C. (the thermally conductive plate 110 was heated to approximately 250° C., to be more precise, unless stated otherwise). The chamber 100 did not include a loadlock (i.e., samples T and B were exposed to air during mounting and removal after etching). As a result, the chamber 100 was purged for 1 hour with the thermally conductive plate 110 heated to the process temperature (between 25° C. and 400° C.) in order to minimize moisture levels after the samples T and B were placed in the chamber 100. One of ordinary skill in the art will recognize that similar or different chambers may be used without departing from the teachings herein.

The research chamber 100 of FIG. 3 does not include a RF powered and heated bottom electrode/thermally conductive plate 110. The chamber only has heated bottom electrode/thermally conductive plate 110 (it is grounded). The gas outlet is connected to a Fomblin oil pump which is inert to $O_2$ so it doesn't catch fire (commercial embodiments are more likely to use a dry pump). The thermally conductive plate 110 sees some ion bombardment, but minor. The showerhead 105 is not at room temperature, but has good ion bombardment. Another research chamber shown in FIG. 29, which was only used to produce the data from Example 4, was designed to allow RF and temperature capability on the same electrode. One of ordinary skill in the art will recognize that further optimization of the results below will be obtained when transferred to commercial, rather than R&D, systems.

Figure 4:
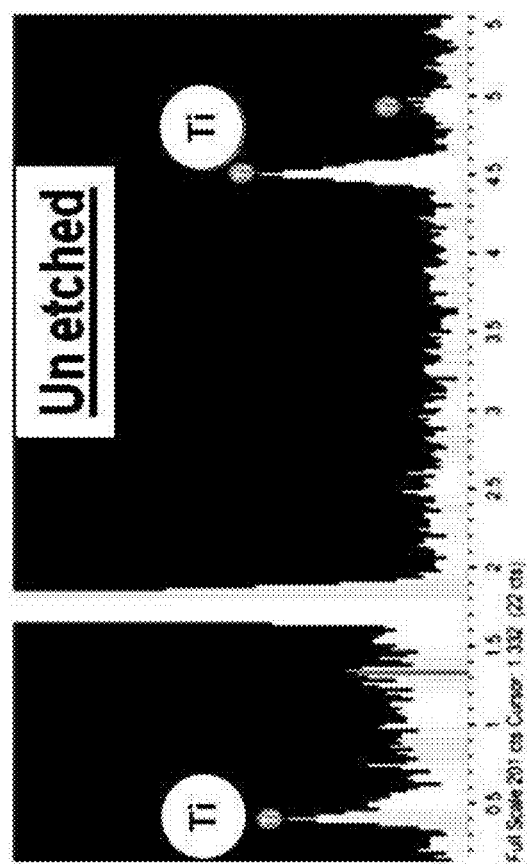
FIG. 4 is a spectrum obtained by energy dispersive x-ray spectroscopy (EDS) of a 8 mm×8 mm Si substrate containing a TiN layer thereon before etching.

The test results in the examples that follow were obtained using ellipsometry, scanning electron microscopy (SEM), energy dispersive x-ray spectroscopy (EDS), or 2 probe resistance measurements (MDC Vacuum Products probe setup and Keithley Instruments multimeter). The SEM film thickness results reported below have a ±10 nm margin of error due to measurement limitations. The EDS spectrum for the starting TiN layer on the silicon substrate is provided in FIG. 4. As is evident, the qualitative presence of Ti is seen at its expected energy numbers around 0.5 keV and 4.5 keV of the EDS spectrum. The N peak overlaps with the Ti peak at 0.5 keV, making the N determination impossible. The initial TiN film has resistance of 90 ohms for a film having an approximately 55 nm thickness.

As will be evident, only the chemistry and application of plasma was varied in the examples that follow. Except for comparative examples 6 and 7, the plasma wattage, thermally conductive plate 110 temperature, thermally conductive plate 110 and showerhead 105 distance (i.e., electrode distance), etc., did not change, but may be varied for further process optimization.

Comparative Example 1

TiN Etch Using $Cl_2$ No Plasma

Figure 5:
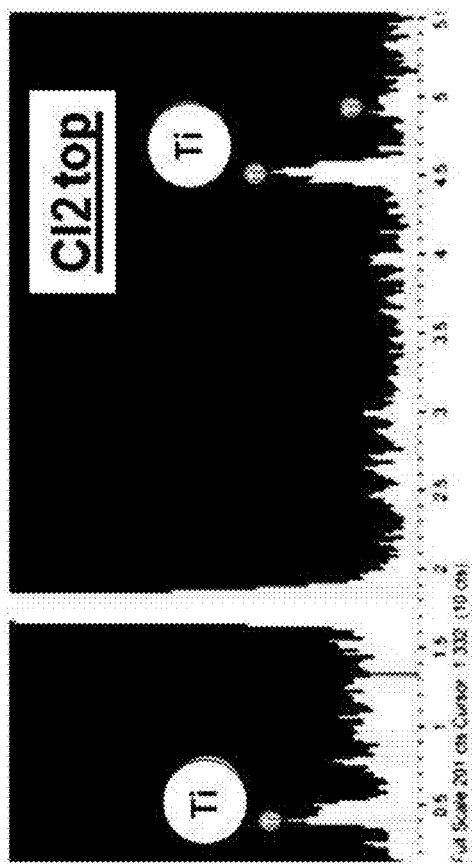
FIG. 5 is a spectrum obtained by EDS of the sample located on the gas showerhead 105 of the chamber 100 of FIG. 3 (the "top sample T") after exposure to $Cl_2$, no plasma.
Figure 6:
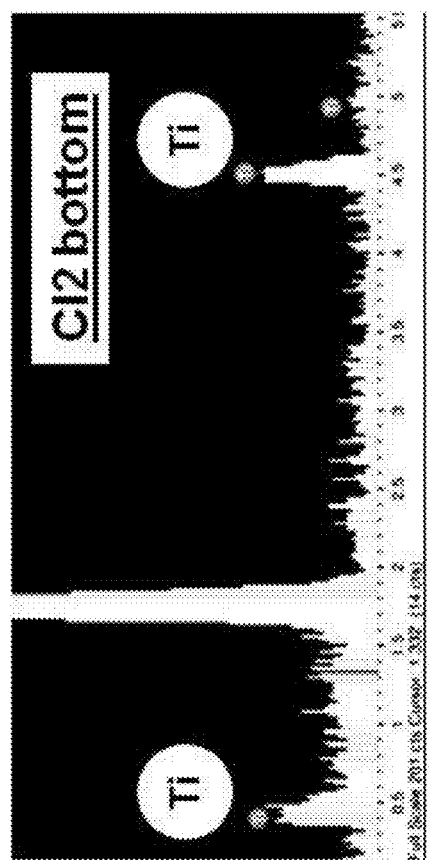
FIG. 6 is a spectrum obtained by EDS of the sample located on the thermally conductive aluminum plate 110 of the chamber 100 of FIG. 3 (the "bottom sample B") after exposure to $Cl_2$, no plasma.

Approximately 50 sccm Ar and approximately 20 sccm $Cl_2$ were introduced through the showerhead 105 into the chamber 100 for 300 seconds. The thermally conductive plate 110 was maintained at 250° C. No plasma was ignited. SEM analysis revealed a TiN film thickness of 49±3 nm for the T sample and 50±1 nm for the B sample. The resistance of the TiN film was 85-89 Ohms for the T sample and 99-102 Ohms for the B sample. The EDS spectrums for the T film is provided in FIG. 5 and for the B film is provided in FIG. 6. As is evident from these results, little or no etching of the TiN film occurs using $Cl_2$ without plasma.

Comparative Example 2

TiN Etch Using Cyclic $Cl_2$ with Plasma

Approximately 50 sccm Ar and approximately 20 sccm $Cl_2$ were introduced through the showerhead 105 into the chamber 100 and the plasma ignited (300 W) for 10 seconds. The thermally conductive plate 110 was maintained at 250° C. The chamber 100 was evacuated and then purged by a 30 second $N_2$ flow. The process was repeated for 100 cycles.

SEM analysis revealed a TiN film thickness of 53±2 nm for the T sample and 54±0 nm for the B sample. The resistance of the TiN film was 97-99 Ohms for the T sample and 105-108 Ohms for the B sample. As is evident from these results, little or no etching of the TiN film occurs using $Cl_2$ with plasma.

Comparative Example 3

TiN Etch Using EtOH No Plasma

Approximately 50 sccm Ar and approximately 5 sccm ethanol (EtOH) were introduced through the showerhead 105 into the chamber 100 for 65 minutes. The thermally conductive plate 110 was maintained at 250° C. The vacuum of the chamber 100 was used to pull the EtOH vapor from the headspace of the EtOH container (not shown) and introduce it to the chamber 100. The thermally conductive plate 110 was maintained at 250° C. No plasma was ignited. SEM analysis revealed a TiN film thickness of 52±1 nm for the T sample and 48±0 nm for the B sample. The resistance of the TiN film was 85 Ohms for the T sample and 101-102 Ohms for the B sample. As is evident from these results, little to no etching of the TiN film occurs using EtOH without plasma.

Comparative Example 4

TiN Etch Using Cyclic EtOH with Plasma

Approximately 50 sccm Ar and approximately 5 sccm EtOH were introduced for 90 seconds through the showerhead 105 into the chamber 100. The thermally conductive plate 110 was maintained at 250° C. After 60 seconds of introduction in order to provide gaseous equilibrium, the plasma was ignited (300 W) for 30 seconds. The thermally conductive plate 110 was maintained at 250° C. The chamber 100 was evacuated and purged by a 30 second $N_2$ flow. The process was repeated for 100 cycles.

SEM analysis revealed a TiN film thickness of 59±1 nm for the T sample and 55±1 nm for the B sample. The resistance of the TiN film was 87-89 Ohms for the T sample and 94-95 Ohms for the B sample. As is evident from these results, little or no etching of the TiN film occurs using EtOH with plasma.

Comparative Example 5

TiN Etch Using $CF_4$

Figure 7:
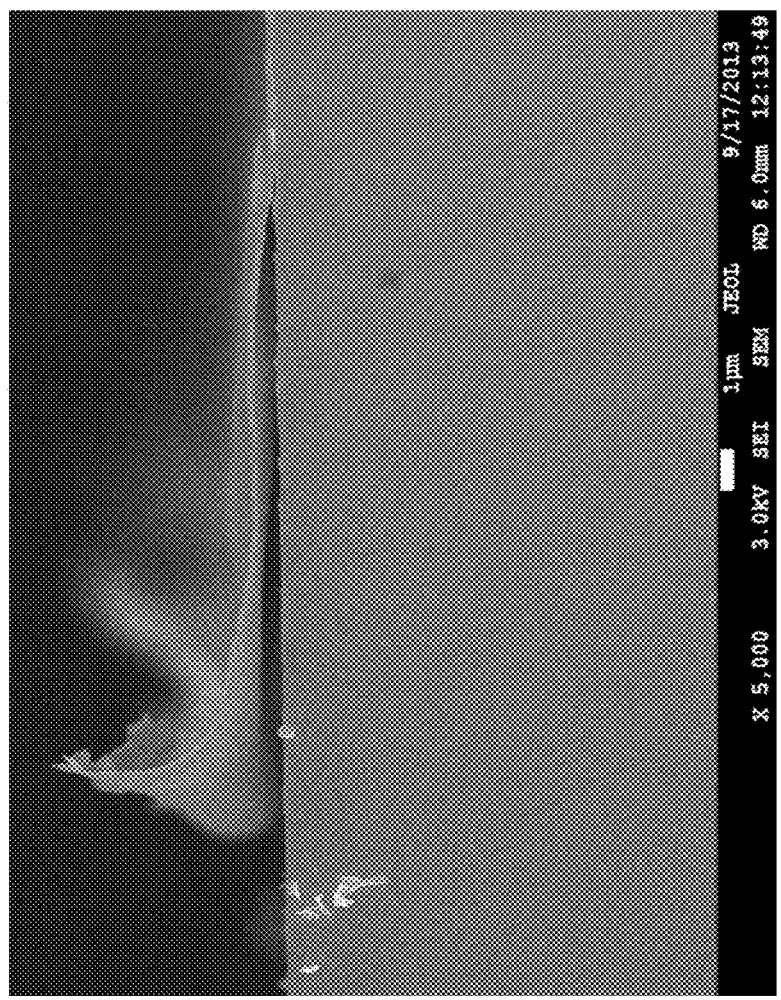
FIG. 7 is a scanning electron microscope photograph of a TiN film taken after 300 seconds of etching with plasma Ar and $CF_4$.

Approximately 50 sccm Ar and approximately 50 sccm $CF_4$ were introduced through the showerhead 105 into the chamber 100. Pressure in the chamber was approximately 0.5 Torr. The thermally conductive plate 110 was maintained at 250° C. The plasma was ignited by 400 W. FIG. 7 is a SEM photo taken after 300 seconds reveal that the TiN layer was peeling. Peeling is detrimental in etch processes because the progression of the material removal process is not linear and not predictable. In addition, peeling removes material in larger sizes than individual molecules, e.g., particulates. Particulates may or may not exit the chamber and, if remaining inside the chamber, may fall onto the wafer and cause defects on the device.

Comparative Example 6

Ni, Co, Pd, or Fe Etch Using Cyclic $Cl_2$

In this example, four approximately 8 mm×8 mm Si (100) substrates containing an approximately 15 nm Ti layer were placed on the thermally conductive plate 110. Each substrate had an approximately 100 nm layer of Ni, Co, Pd, or Fe on top of the Ti layer.

Approximately 30 sccm Ar and approximately 5 sccm $Cl_2$ were introduced through the showerhead 105 into the chamber 100 and the plasma ignited (0, 100, or 200 W) for 10 seconds. The thermally conductive plate 110 was maintained at 100° C. or 240° C. The chamber 100 was evacuated and then purged by a 30 second $N_2$ flow. The process was repeated for 100 cycles.

Figure 30:
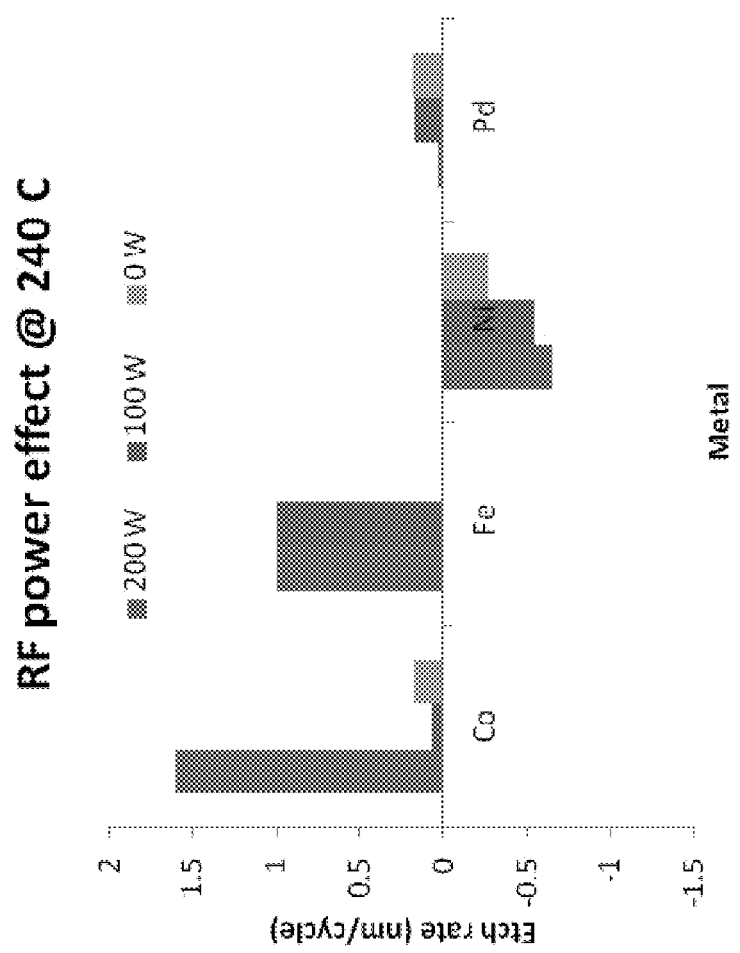
FIG. 30 is a graph comparing the etch rate (nm/cycle) of Co, Fe, Ni, and Pd using cyclic $Cl_2$ and varying power (0, 100, and 200 W) at 240° C.
Figure 31:
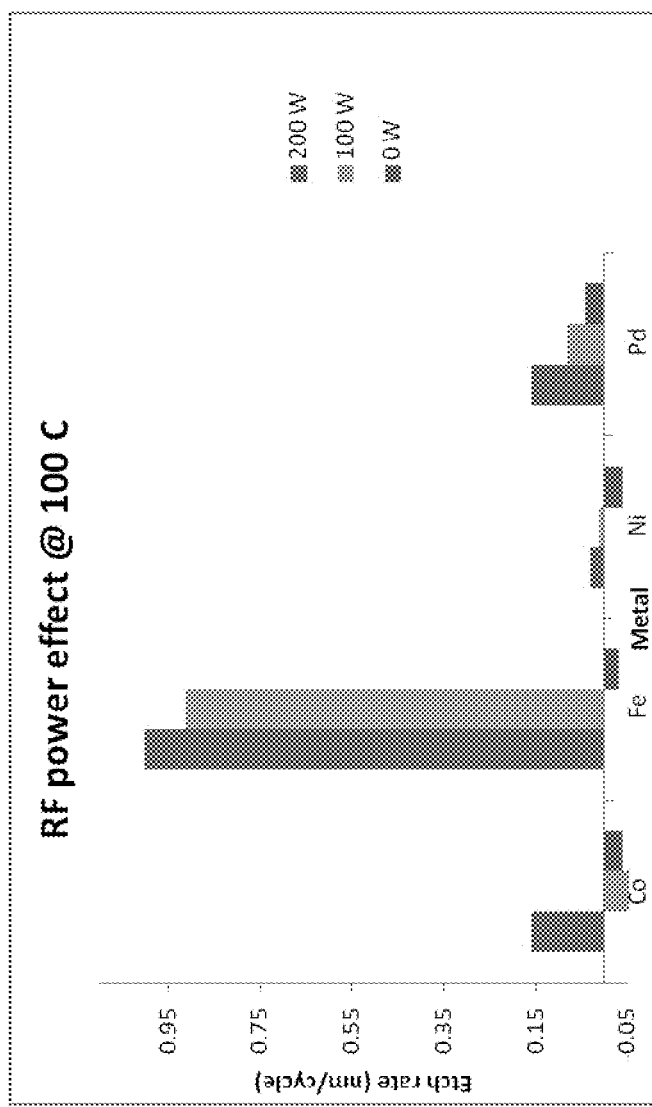
FIG. 31 is a graph comparing the etch rate (nm/cycle) of Co, Fe, Ni, and Pd using cyclic $Cl_2$ and varying power (0, 100, and 200 W) at 100° C.

The results at 240° C. are summarized in FIG. 30. The results at 100° C. are summarized in FIG. 31. As illustrated therein, Fe was completely etched at 100 W and 200 W at both 100° C. and 240° C., but not at 0 W at either temperature. Cobalt was etched at 200 W at 100° C. and 240° C., but not (or negligibly) at 0 or 100 W. Pd and Ni had no to negligible etching under all conditions.

Comparative Example 7

Ni, Co, Pd, or Fe Etch Using Cyclic Acetylacetonate

In this example, four approximately 8 mm×8 mm Si (100) substrates containing an approximately 15 nm Ti layer were placed on the thermally conductive plate 110. Each substrate had an approximately 100 nm layer of Ni, Co, Pd, or Fe on top of the Ti layer.

Approximately 30 sccm Ar and approximately 30 mTorr (partial pressure) of Acac were introduced through the showerhead 105 into the chamber 100 and the plasma ignited (200 W) for 10 seconds. The thermally conductive plate 110 was maintained at 240° C. The chamber 100 was evacuated and then purged by a 30 second $N_2$ flow. The process was repeated for 25 or 100 cycles.

Figure 32:
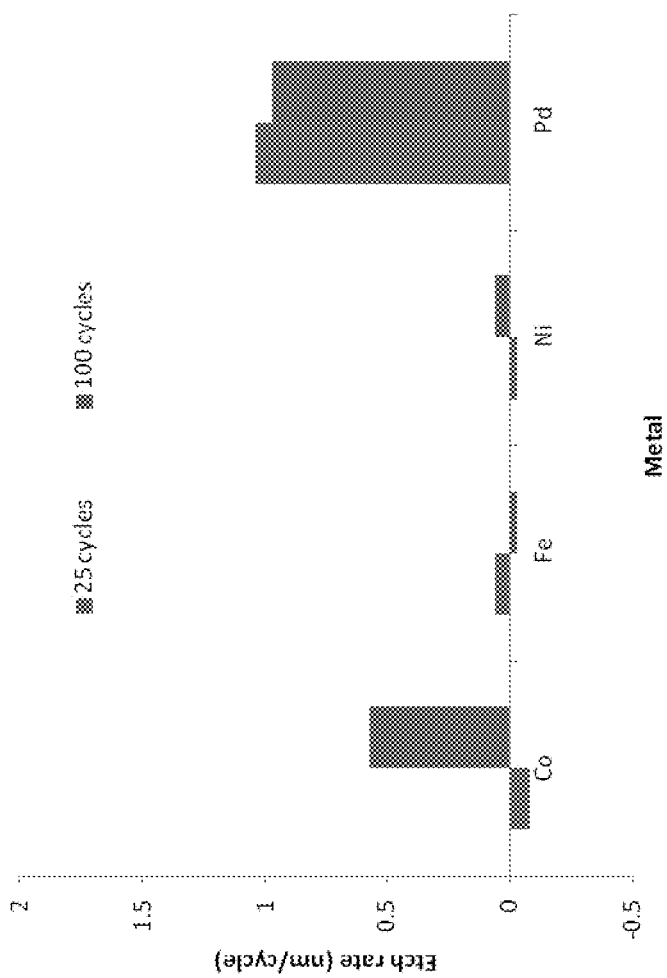
FIG. 32 is a graph comparing the etch rate (nm/cycle) of Co, Fe, Ni, and Pd using cyclic aceylacetonate at 25 cycles vs. 100 cycles.

The results at are summarized in FIG. 32. As illustrated therein, a constant etch rate was observed for Pd. Co exhibited no etching at 25 cycles but approximately 50 nm of Co was removed after 100 cycles, demonstrating some kind of incubation effect. Little to no etching of Fe or Ni occurred.

Example 1

TiN Etch

Approximately 50 sccm Ar and approximately 20 sccm $Cl_2$ were introduced through the showerhead 105 into the chamber 100 and the plasma ignited (300 W) for 10 seconds. The thermally conductive plate 110 was maintained at 250° C. The chamber 100 was evacuated and purged by a 30 second $N_2$ flow. Approximately 50 sccm Ar and approximately 5 sccm EtOH were introduced for 90 seconds through the showerhead 105 into the chamber 100. After 60 seconds of introduction in order to provide gaseous equilibrium, the plasma was ignited (300 W) for 30 seconds. The chamber 100 was evacuated and purged by a 30 second $N_2$ flow. The process was repeated for 100 cycles.

Figure 8:
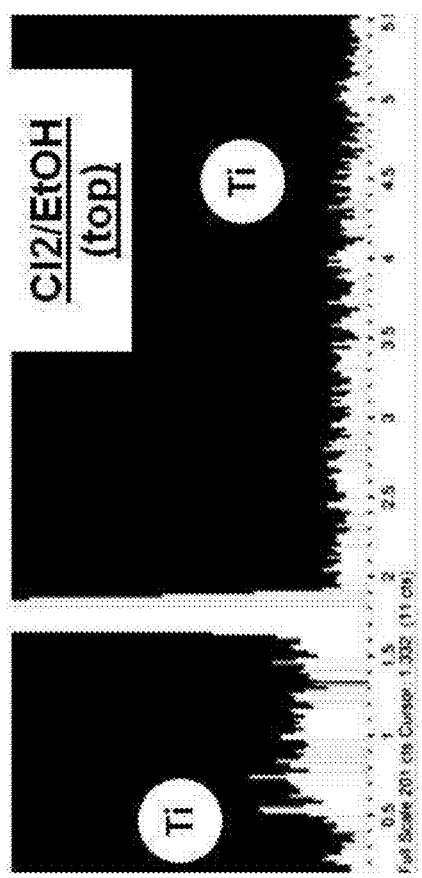
FIG. 8 is a spectrum obtained by EDS of the top sample T after exposure to 100 cycles of $Cl_2$ with plasma followed by ethanol with plasma.
Figure 9:
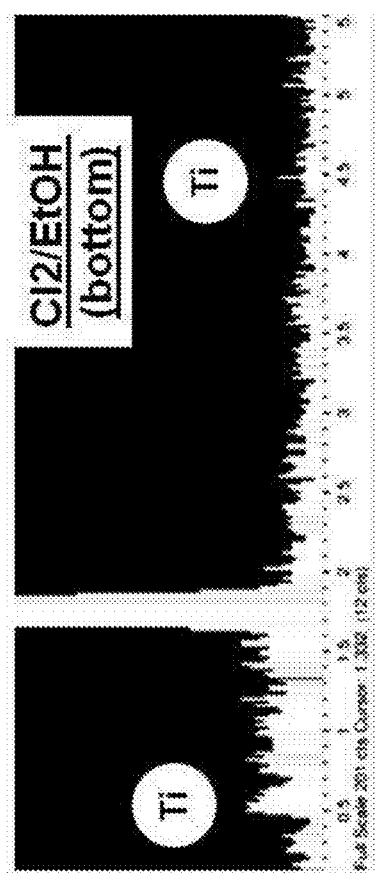
FIG. 9 is a spectrum obtained by EDS of the bottom sample B after exposure to 100 cycles of $Cl_2$ with plasma followed by ethanol with plasma.

SEM analysis revealed a TiN film thickness of 0 nm for both the T and B samples. The resistance of the TiN film was 0.2M-0.7M Ohms for the T sample and 0.018M Ohms for the B sample. The EDS spectrums for the T film is provided in FIG. 8 and for the B film is provided in FIG. 9. As is evident from these results, little to no TiN film remains after performing the disclosed etching process.

Example 2

TiN Etch

Figure 10:
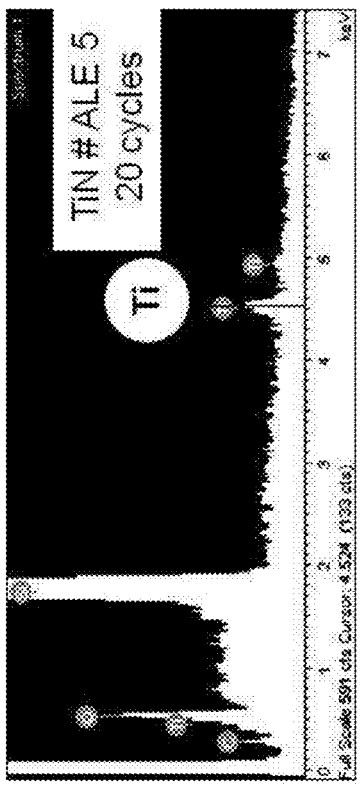
FIG. 10 is a spectrum obtained by EDS of the bottom sample B after exposure to 10 cycles of $Cl_2$ with plasma followed by ethanol with plasma.

Approximately 50 sccm Ar and approximately 20 sccm $Cl_2$ were introduced through the showerhead 105 into the chamber 100 and the plasma ignited (300 W) for 10 seconds. The thermally conductive plate 110 was maintained at 250° C. The chamber 100 was evacuated and purged by a 30 second $N_2$ flow. Approximately 50 sccm Ar and approximately 5 sccm EtOH were introduced for 90 seconds through the showerhead 105 into the chamber 100. After 60 seconds of introduction in order to provide gaseous equilibrium, the plasma was ignited (300 W) for 30 seconds. The chamber 100 was evacuated and purged by a 30 second $N_2$ flow. The process was repeated for 10 cycles. The EDS spectrum for the B film is provided in FIG. 10.

Figure 11:
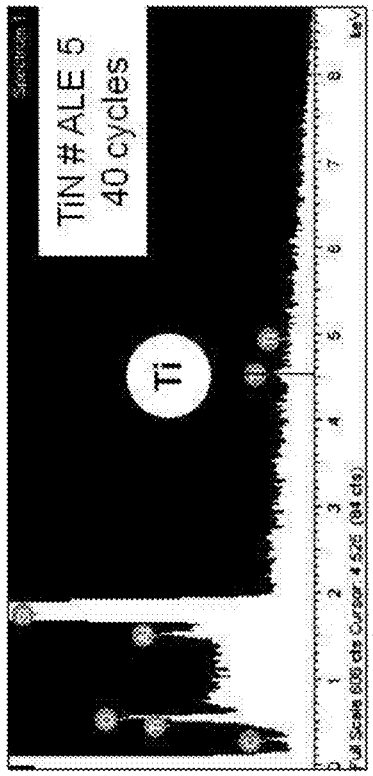
FIG. 11 is a spectrum obtained by EDS of the bottom sample B after exposure to 20 cycles of $Cl_2$ with plasma followed by ethanol with plasma.

Approximately 50 sccm Ar and approximately 20 sccm $Cl_2$ were introduced through the showerhead 105 into the chamber 100 and the plasma ignited (300 W) for 10 seconds. The thermally conductive plate 110 was maintained at 250° C. The chamber 100 was evacuated and purged by a 30 second $N_2$ flow. Approximately 50 sccm Ar and approximately 5 sccm EtOH were introduced for 90 seconds through the showerhead 105 into the chamber 100. After 60 seconds of introduction in order to provide gaseous equilibrium, the plasma was ignited (300 W) for 30 seconds. The chamber 100 was evacuated and purged by a 30 second $N_2$ flow. The process was repeated for 20 cycles. The EDS spectrum for the B film is provided in FIG. 11.

Figure 12:
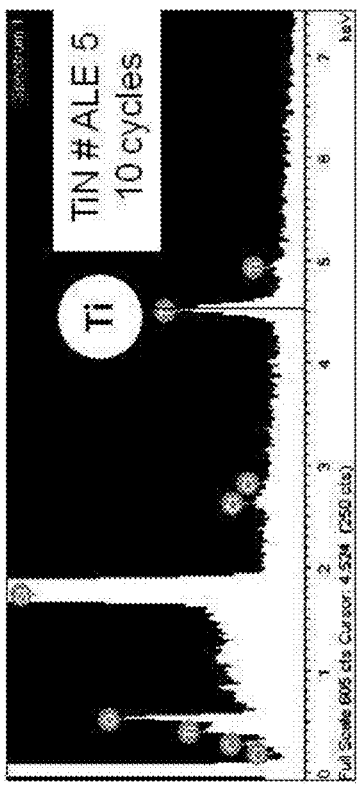
FIG. 12 is a spectrum obtained by EDS of the bottom sample B after exposure to 30 cycles of $Cl_2$ with plasma followed by ethanol with plasma.

Approximately 50 sccm Ar and approximately 20 sccm $Cl_2$ were introduced through the showerhead 105 into the chamber 100 and the plasma ignited (300 W) for 10 seconds. The thermally conductive plate 110 was maintained at 250° C. The chamber 100 was evacuated and purged by a 30 second $N_2$ flow. Approximately 50 sccm Ar and approximately 5 sccm EtOH were introduced for 90 seconds through the showerhead 105 into the chamber 100. After 60 seconds of introduction in order to provide gaseous equilibrium, the plasma was ignited (300 W) for 30 seconds. The chamber 100 was evacuated and purged by a 30 second $N_2$ flow. The process was repeated for 30 cycles. The EDS spectrum for the B film is provided in FIG. 12.

Figure 13:
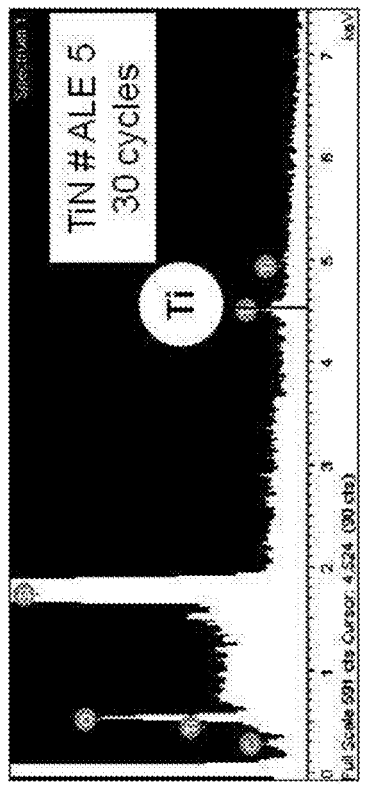
FIG. 13 is a spectrum obtained by EDS of the bottom sample B after exposure to 40 cycles of $Cl_2$ with plasma followed by ethanol with plasma.

Approximately 50 sccm Ar and approximately 20 sccm $Cl_2$ were introduced through the showerhead 105 into the chamber 100 and the plasma ignited (300 W) for 10 seconds. The thermally conductive plate 110 was maintained at 250° C. The chamber 100 was evacuated and purged by a 30 second $N_2$ flow. Approximately 50 sccm Ar and approximately 5 sccm EtOH were introduced for 90 seconds through the showerhead 105 into the chamber 100. After 60 seconds of introduction in order to provide gaseous equilibrium, the plasma was ignited (300 W) for 30 seconds. The chamber 100 was evacuated and purged by a 30 second $N_2$ flow. The process was repeated for 40 cycles. The EDS spectrum for the B film is provided in FIG. 13.

Figure 14:
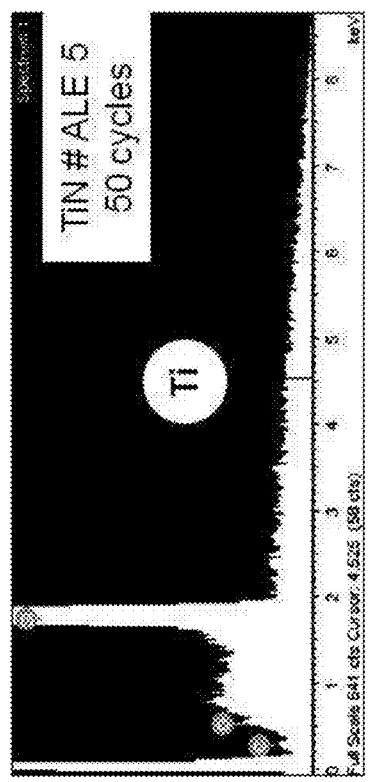
FIG. 14 is a spectrum obtained by EDS of the bottom sample B after exposure to 50 cycles of $Cl_2$ with plasma followed by ethanol with plasma.

Approximately 50 sccm Ar and approximately 20 sccm $Cl_2$ were introduced through the showerhead 105 into the chamber 100 and the plasma ignited (300 W) for 10 seconds. The thermally conductive plate 110 was maintained at 250° C. The chamber 100 was evacuated and purged by a 30 second $N_2$ flow. Approximately 50 sccm Ar and approximately 5 sccm EtOH were introduced for 90 seconds through the showerhead 105 into the chamber 100. After 60 seconds of introduction in order to provide gaseous equilibrium, the plasma was ignited (300 W) for 30 seconds. The chamber 100 was evacuated and purged by a 30 second $N_2$ flow. The process was repeated for 50 cycles. The EDS spectrum for the B film is provided in FIG. 14.

Figure 15:
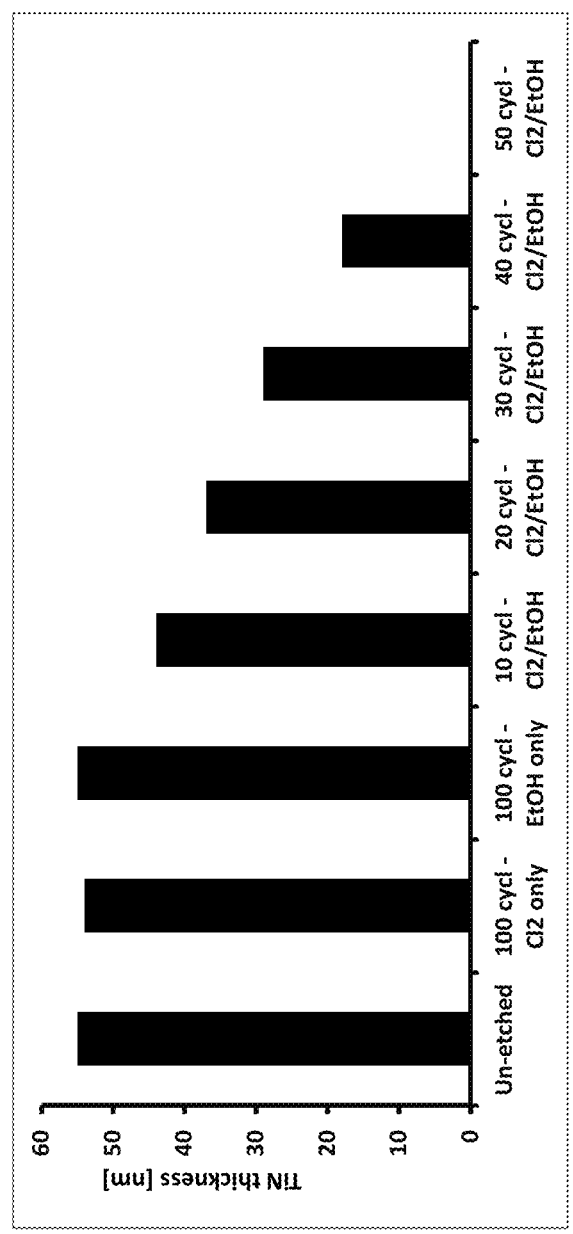
FIG. 15 is a graph comparing the TiN layer thickness in nm after the etch processes of Comparative Example 2 and 4 and Example 2.

As can be seen from FIGS. 10-14, the amount of Ti in the TiN layer decreased as the number of cycles increased, illustrating the epitaxial nature of the removal process. The results of Comparative Examples 2 and 4 and Example 2 are summarized in FIG. 15.

Example 3

Fe and Pd Etch Using $Cl_2$ and Ethanol (EtOH)

In this example, double sided carbon tape (not shown) was used to adhere an approximately 8 mm×8 mm Si (100)

substrate containing an approximately 15 nm Ti layer with an approximately 100 nm Pd layer deposited thereon (in other words Pd/Ti/Si) to the showerhead 105 (the "top sample T"). An approximately 8 mm×8 mm Si (100) substrate containing an approximately 15 nm Ti layer with an approximately 100 nm Fe layer deposited thereon (in other words Fe/Ti/Si) was placed on the thermally conductive plate 110.

Approximately 50 sccm Ar and approximately 20 sccm $Cl_2$ were introduced through the showerhead 105 into the chamber 100 and the plasma ignited (300 W) for 10 seconds. The thermally conductive plate 110 was maintained at 250° C. The chamber 100 was evacuated and purged by a 30 second $N_2$ flow. Approximately 50 sccm Ar and approximately 10 sccm EtOH were introduced for 30 seconds through the showerhead 105 into the chamber 100. After 60 seconds of introduction in order to provide gaseous equilibrium, the plasma was ignited (300 W) for 30 seconds. The chamber 100 was evacuated and purged by a 30 second $N_2$ flow. The process was repeated.

FIG. 16 is a spectrum obtained by EDS of the Fe layer before etching. FIG. 17 is a spectrum obtained by EDS of the Fe sample after exposure to 15 cycles of $Cl_2$ with plasma followed by ethanol with plasma. FIG. 18 is a spectrum obtained by EDS of the Fe sample after exposure to 30 cycles of $Cl_2$ with plasma followed by ethanol with plasma. FIG. 19 is a spectrum obtained by EDS of the Fe sample after exposure to 45 cycles of $Cl_2$ with plasma followed by ethanol with plasma. FIG. 20 is a spectrum obtained by EDS of the Fe sample after exposure to 74 cycles of $Cl_2$ with plasma followed by ethanol with plasma. FIG. 21 is a spectrum obtained by EDS of a comparative Fe sample subject to 100 cycles of $Cl_2$ with plasma. As can be seen from FIGS. 17-20, the amount of Fe in the layer decreased as the number of cycles increased. Comparing with $Cl_2$ etching in FIG. 21 alone, ethanol was critical to enhance the etching over $Cl_2$ alone.

FIG. 22 is a spectrum obtained by EDS of the Pd layer before etching. FIG. 23 is a spectrum obtained by EDS of the Pd sample after exposure to 15 cycles of $Cl_2$ with plasma followed by ethanol with plasma. FIG. 24 is a spectrum obtained by EDS of the Pd sample after exposure to 30 cycles of $Cl_2$ with plasma followed by ethanol with plasma. FIG. 25 is a spectrum obtained by EDS of the Pd sample after exposure to 45 cycles of $Cl_2$ with plasma followed by ethanol with plasma. FIG. 26 is a spectrum obtained by EDS of the Pd sample after exposure to 74 cycles of $Cl_2$ with plasma followed by ethanol with plasma. FIG. 27 is a spectrum obtained by EDS of a comparative Pd sample subject to 100 cycles of $Cl_2$ with plasma. As can be seen from FIGS. 23-26, the amount of Pd in the layer decreased as the number of cycles increased. Comparing with $Cl_2$ etching in FIG. 27 alone, ethanol was critical to enhance the etching over $Cl_2$ alone.

Example 4

Etch Using $Cl_2$ and Acetylacetonate (Acac)

Figure 29:
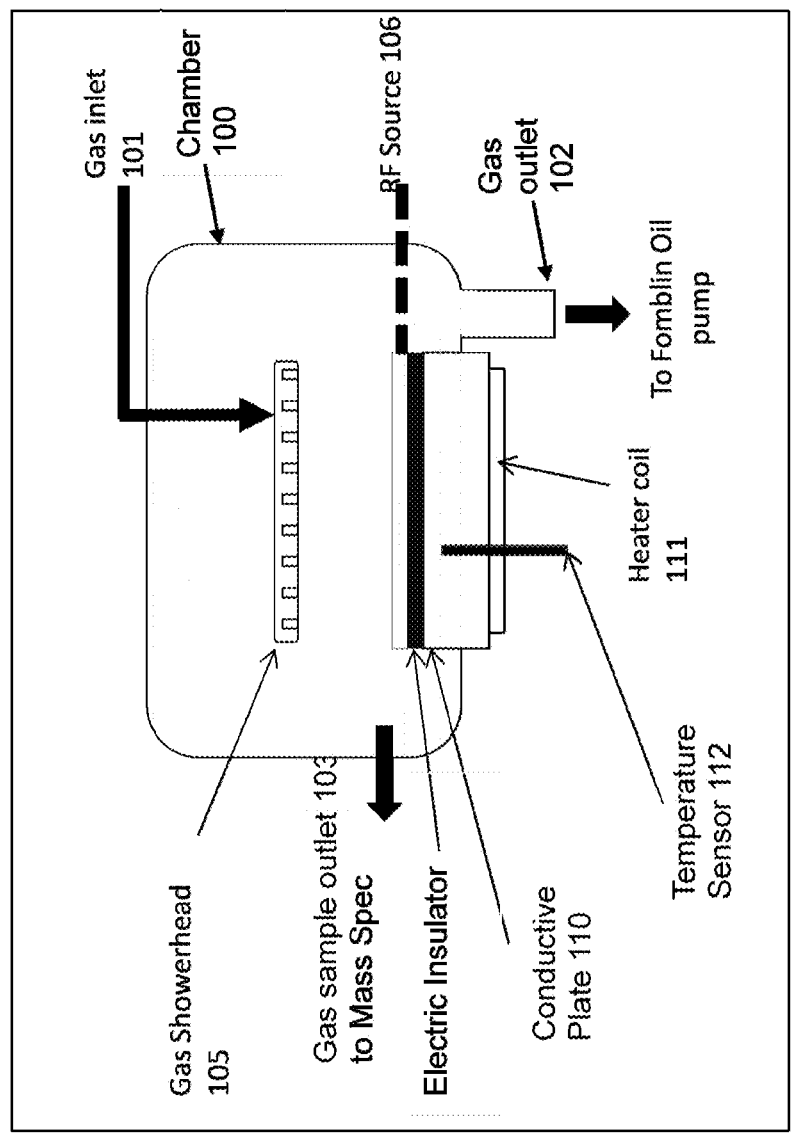
FIG. 29 is a diagram of the modified experimental chamber used in Comparative Examples 6 and 7 and Example 4.

In this example, four approximately 8 mm×8 mm Si (100) substrates containing an approximately 15 nm Ti layer were placed on the thermally conductive plate 110 in the modified chamber of FIG. 29. Each substrate had an approximately 100 nm layer of Ni, Co, Pd, or Fe on top of the Ti layer.

Approximately 30 sccm Ar and approximately 5 sccm $Cl_2$ were introduced through the showerhead 105 into the chamber 100 and the plasma ignited (200 W) for 10 seconds. The thermally conductive plate 110 was maintained at 240° C. The chamber 100 was evacuated and purged by a 30 second $N_2$ flow. Approximately 30 sccm Ar and approximately 30 mTorr partial pressure of acetylacetonate were introduced through the showerhead 105 into the chamber 100. After 60 seconds of introduction in order to provide gaseous equilibrium, the plasma was ignited (200 W) for 30 seconds. The chamber 100 was evacuated and purged by a 30 second $N_2$ flow.

The Cobalt film was etched at a rate of approximately 1.6 nm/cycle. The Iron film was etched at a rate of approximately 1 nm/cycle. No etching of the Ni film occurred. The Pd film was etched at a rate of approximately 1.25 nm/cycle.

Additional testing was performed comparing the etch rate for 25 cycles vs. 100 cycles. Both Co and Pd exhibited similar etch rates, indicating controllable, repeatable results. The iron etch rate was 4 times higher after 25 cycles than it was after 100 cycles, indicating that etching occurs faster during the first few cycles.

Figure 28:
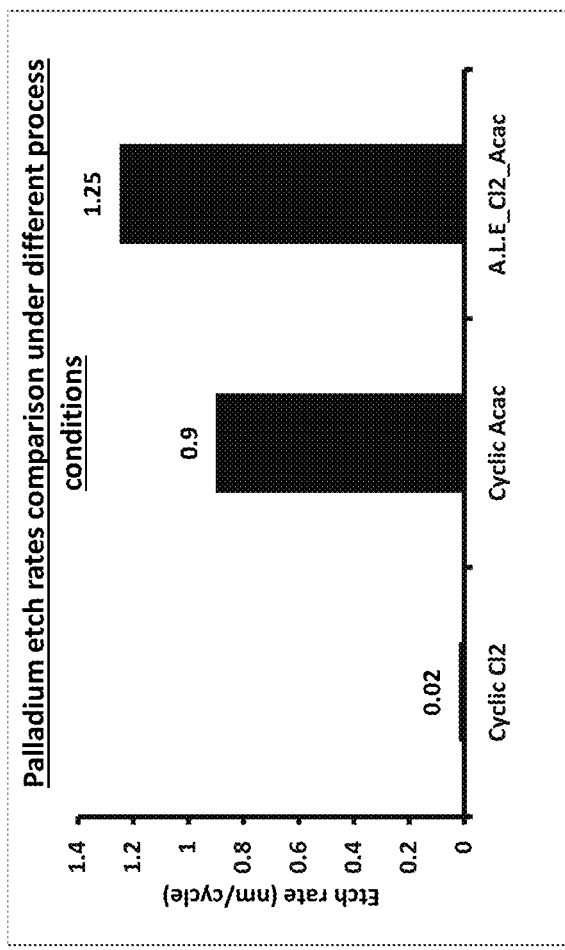
FIG. 28 is a graph comparing the Pd etch rate (nm/cycle) from a cyclic $Cl_2$ etch process, a cyclic acetylacetonate etch process, and a cyclic etch process using both $Cl_2$ and acetylacetonate.

FIG. 28 is a graph comparing the Pd etch rate (in nm/cycle) from a cyclic $Cl_2$ etch process alone, a cyclic acetylacetonate etch process alone, and a cyclic etch process using both $Cl_2$ and acetylacetonate. FIG. 28 shows $Cl_2$ alone cannot remove the Pd film, Acac alone successfully etched Pd when used alone at the conditions listed, and that the cyclic combination of $Cl_2$ and Acac produced unexpected synergistic effects over the process for either $Cl_2$ or Acac alone.

Based on these results, one of ordinary skill in the art would expect other elements to behave similarly to Pd based on the prior acetylacetonate (acac) cycle data (cite Jane Chang citing S. W. Kang et al., JVST B, 17 (1999) 154 showing acac Fe, Ni, and Cu forms $M(acac)_2$ and acac tfac and hfac also work with Ni (R. I. Masel et al. JVST A. 16 (1998) 3259).

Example 5

TiN Etch with $Ar/CF_4$

Approximately 50 sccm Ar and approximately 10 sccm $CF_4$ were introduced through the showerhead 105 into the chamber 100 and the plasma ignited (300 W) for 10 seconds. The thermally conductive plate 110 was maintained at 250° C. The chamber 100 was evacuated and purged by a 30 second $N_2$ flow. Approximately 50 sccm Ar and approximately 5 sccm EtOH were introduced for 90 seconds through the showerhead 105 into the chamber 100. After 60 seconds of introduction in order to provide gaseous equilibrium, the plasma was ignited (300 W) for 30 seconds. The chamber 100 was evacuated and purged by a 30 second $N_2$ flow. The process was repeated for 100 cycles.

SEM analysis revealed a TiN film thickness on top mounted sample (T), reduced from ~55 nm to ~40 nm after 100 cycles. Bottom sample had no film remaining. Too high a temperature at the bottom electrode may have lead to Ti/Si interface loss and potential peeling. The lower temperature of the top electrode combined with ethanol has shown controlled etching of TiN. Further experiments as a function of cycles can be repeated to validate further.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present inven-

We claim:

1. A method of removing a material from a substrate, the method comprising:
   (a) introducing a vapor of a halide-containing compound into a chamber containing the substrate having the material disposed thereon;
   (b) igniting a plasma in the chamber;
   (c) purging the chamber;
   (d) introducing a vapor of a volatile organic compound into the chamber; and
   (e) purging the chamber,
   wherein the volatile organic compound is selected from the group consisting of N,N'-bis(1-methylethyl)-ethanimidiamide (CAS 106500-93-0), methanol, ethanol, isopropanol, acetic acid, 4-ethylamino-pent-3-en-2-one, N,N-diethylpentadiamine, bis(trimethylsilyl)amide, and bis(silyl)amide having the formula $R_3SiNHSiR_3$, wherein each R is independently selected from a C1 to C5 alkyl group.

2. The method of claim 1, further comprising repeating steps (a) through (e).

3. The method of claim 1, further comprising igniting a plasma after introduction of the vapor of the volatile organic compound.

4. The method of claim 3, further comprising repeating the halide-containing compound introduction, ignition, purging, volatile organic compound introduction, ignition, and purging steps.

5. The method of claim 1, wherein the material is selected from the group consisting of Ti, Ta, W, Al, Pd, Ir, Co, Fe, B, Cu, Ni, Pt, Ru, Mn, Mg, Cr, Au, alloys thereof, oxides thereof, nitrides thereof, and combinations thereof.

6. The method of claim 1, wherein the halide-containing compound is selected from the group consisting of $F_2$, $Cl_2$, $Br_2$, $I_2$, FCl, $ClF_3$, $BCl_3$, $BBr_3$, $BF_3$, $BI_3$, HCl, HBr, HI, $CF_4$, $CH_2F_2$, $CHF_3$, $CF_3I$, $CF_3Br$, FNO, $NF_3$, $SOCl_2$, $SO_2Cl_2$, and combinations thereof.

7. The method of claim 1, wherein the volatile organic compound is N,N'-bis(1-methylethyl)-ethanimidiamide (CAS 106500-93-0).

8. The method of claim 1, wherein the volatile organic compound is selected from the group consisting of methanol, ethanol, and isopropanol.

9. The method of claim 1, wherein the volatile organic compound is acetic acid.

10. The method of claim 1, wherein the volatile organic compound is 4-ethylamino-pent-3-en-2-one.

11. The method of claim 1, wherein the volatile organic compound is N,N-diethylpentadiamine.

12. The method of claim 1, wherein the volatile organic compound has the formula $R_3Si$—NH—$SiR_3$, wherein each R is independently selected from a C1 to C5 alkyl group.

13. The method of claim 12, wherein the volatile organic compound is bis(trimethylsilyl)amide.

14. The method of claim 1, wherein performing steps (a) through (e) one time removes one atomic layer of the material.

* * * * *